(12) United States Patent
Kondo et al.

(10) Patent No.: US 7,745,990 B2
(45) Date of Patent: Jun. 29, 2010

(54) WHITE LIGHT EMITTING ORGANIC ELECTROLUMINESCENT ELEMENT AND LIGHTING DEVICE

(75) Inventors: Toshiya Kondo, Tokyo (JP); Tomoyuki Nakayama, Tokyo (JP); Kunimasa Hiyama, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 136 days.

(21) Appl. No.: 12/050,480

(22) Filed: Mar. 18, 2008

(65) Prior Publication Data
US 2008/0238305 A1    Oct. 2, 2008

(30) Foreign Application Priority Data
Mar. 29, 2007    (JP)    ............... 2007-087241

(51) Int. Cl.
*H01J 1/62*    (2006.01)
(52) U.S. Cl. ............... 313/504; 313/506; 428/917
(58) Field of Classification Search ............... None
See application file for complete search history.

(56) References Cited

U.S. PATENT DOCUMENTS 6,097,147 A    8/2000    Baldo et al.
7,189,466 B2*  3/2007   Moriyama et al. ............ 428/690
7,192,659 B2*  3/2007   Ricks et al. ................... 428/690

FOREIGN PATENT DOCUMENTS

| JP | 6207170 | 7/1994 |
|----|---------|--------|
| JP | 2004235168 | 8/2004 |
| JP | 2005006165 | 1/2005 |
| WO | 2004077886 | 9/2004 |

* cited by examiner

*Primary Examiner*—Ashok Patel
(74) *Attorney, Agent, or Firm*—Lucas & Mercanti, LLP

(57) ABSTRACT

A white light-emitting organic electroluminescent element is disclosed, containing a substrate having thereon: an anode; a cathode; and a plurality of light emitting layers between the anode and the cathode, wherein the plurality of light emitting layers contains: a first light emitting layer which emits a light having a predetermined wavelength; a second light emitting layer which is located at a nearer position to the anode than the first light emitting layer and emits a light having a complementary color to the light having the predetermined wavelength; and a third light emitting layer which is located at a nearer position to the cathode than the first light emitting layer and emits the light having the complementary color to the light having the predetermined wavelength.

5 Claims, 2 Drawing Sheets

WHITE LIGHT EMITTING ORGANIC ELECTROLUMINESCENT ELEMENT AND LIGHTING DEVICE

This application is based on Japanese Patent Application No. 2007-087241 filed on Mar. 29, 2007 with Japan Patent Office, the entire content of which is hereby incorporated by reference.

TECHNICAL FIELD

The present invention relates to a white light emitting organic electroluminescent element and a lighting device employing the same.

BACKGROUND

As a light emitting type electronic display device, available are electroluminescent displays (hereinafter referred to as ELD). ELD constituting elements include inorganic electroluminescent elements (hereinafter also referred to as inorganic EL elements) and organic electroluminescent elements (hereinafter also referred to as organic EL). The inorganic EL elements have been employed as a flat type light source, and high alternating-current voltage is needed to drive them.

On the other hand, the organic electroluminescent elements emit light (fluorescence and phosphorescence) as follows. They are constituted in such a manner that a light emitting layer, which incorporates light emitting compounds, is sandwiched between a cathode and an anode, and electrons and positive holes are injected into the light emitting layer, wherein excitons are generated via their recombination, and when the resulting excitons are deactivated, light is emitted. In view of capability of light emission at a few to several ten volts, wide viewing angle due to a self light emitting type, high visibility, and space saving and portability due to a complete thin layer type solid element, organic electroluminescent elements have received attention.

Further, in recent years, in the organic electroluminescent elements, development of luminescent materials which enable preparation of organic electroluminescent element of a higher phosphorescence luminance has been diligently carried out (refer, for example, to Patent Documents 1 and 2). In conventional luminescent materials, light is emitted from an excited singlet and is called as fluorescence. Since the formation ratio of singlet excitons to triplet excitons is 1:3, the formation probability of light emitting excited species is 25%. On the other hand, in the case of luminescent materials utilizing the light emitted from the excited triplet and is called as phosphorescence, the upper limit of the internal quantum efficiency reaches 100% via internal conversion from the singlet excitons to the triplet excitons, whereby, compared to the case of fluorescence emitting materials, the maximum light emitting efficiency becomes, in principle, four times as great.

Further, the major feature of organic electroluminescent elements is in the form of a surface light source differing from conventionally employed main light sources such as a light emitting diode or a cold-cathode tube. Possible applications, which utilize the above characteristic, include light sources for lighting and backlight of various displays. It is appropriate to employ them as a backlight of liquid crystal full color displays, of which demand is markedly increasing over recent years.

When organic electroluminescent elements are employed as the above lighting source or the display backlight, they are employed as a light source which realizes white or electric bulb color (hereinafter together referred to as white). In order to realize white light emission employing organic electroluminescent elements, there available are: a method which realizes white via color mixture by regulating a plurality of light emitting materials differing in their emitted light wavelength in a single element; a method which realizes white in such a manner that for example, three colors of blue, green, and red are separately painted and they are simultaneously emitted while being mixed; and a method which realize white employing color conversion dyes (for example, a combination of a blue light emitting material and a color conversion fluorescent dye).

However, when consideration is made based on various demands such as lower cost, higher productivity, or more convenient driving methods which are demanded for the backlight, the method which realizes white via color mixture by regulating a plurality of light emitting materials which differ in emitted light wavelengths in a single element, is useful for these applications, and in recent years, research and development of the same have been increasingly conducted.

The method which realizes white based on the above method will further be detailed. There are listed: a method which realize white in such a manner that two different color light emitting materials, such as a blue light emitting material and a yellow light emitting material which result in a complementary color and the colors are mixed, and a method which realizes white in such a manner that light emitting materials of three color of blue, green, and red are employed and the colors are mixed. For example, disclosed is a method in which doping is carried out employing three phosphors, blue, green and red, as a light emitting material (for example, Patent documents 2 and 3).

Further, there is a system in which in organic electroluminescent elements which result in white light emission, each of the layers which differ in emitted light color is not in the form of an individual layer, but at least two color light emitting materials are made to coexist in a single layer, and two color lights are emitted via an energy transfer from a light emitting dopant with high light emitting energy to a light emitting dopant with a relatively low efficiency. The above method is one of the promising methods to prepare white light emitting organic EL elements since via them, it is possible to reduce the number of organic layers and to decrease the employed amount of light emitting materials. An organic electric field light emitting element is disclosed which is characterized in that a red light emitting layer and a blue light emitting layer are sequentially arranged from the anode, and the red light emitting layer incorporates at least one green color light emitting dopant (refer, for example, to Patent Document 4).

In view of color rendering and the color reproduction range, it is preferable that in electroluminescent elements which realize white light emission, at least three color light emitting materials are combined. However, since blending at least three types of light emitting materials into a single layer results in energy transfer to longer wavelength light emitting materials at a low energy level, it is very difficult to regulate the mixing ratio of these light emitting materials, resulting in fluctuations of the resulting performance. Consequently, it is typical that layers which differ in emitted light color are laminated.

However, when light emitting layers, which differ in emitted light color, are laminated, a problem occurs in which when the electric current density of driving electric current varies, a light emitting central position a in the light emitting layer is shifted, whereby emitted light color varies. Specifically, when the light emitting center is located near the interface of the laminated light emitting layer, the light emitting center occasionally shifts into a different color light emitting layer. In view of color rendering and color reproduction, the above shift has been a problem to overcome. An organic electroluminescent element is disclosed, which is capable of retarding the change of emitted light chromaticity by doping the organic light emitting layer, on one side adjacent to the specified organic light emitting layer, with auxiliary light emitting compounds which emit light of a color which is similar to that of the basic light emitting compounds in the above specified organic light emitting layer (for example, Patent Document 5). However, when the above method is employed, the shift of the above light emitting center is permitted only in one direction. Due to that, it becomes necessary to control the carrier conveyance of the host material to increase the restriction of materials and it becomes difficult to simultaneously realize targeted electric power efficiency and targeted light emitting life time.

In either case, it was found that by employing the above methods, when white light emission was achieved, in view of compatibility of the targeted electric power efficiency and stability of chromaticity during driving, no satisfaction was realized. Though, depending on usage, in white light emitting devices, it is commonly demanded that the resulting white chromaticity is stable during driving and for the change of driving electric current. For example, when employed as a lighting source for illumination or a backlight of a liquid crystal display, readily visible changes such that white changes toward blue or red direction significantly degrade commercial value, however high the light emitting efficiency may be. Consequently, it has been demanded to overcome the above drawbacks.

(Patent Document 1) U.S. Pat. No. 6,097,147
(Patent Document 2) Japanese Patent Publication Open to Public Inspection (hereinafter referred to as JP-A) No. 6-207170
(Patent Document 3) JP-A No. 2004-235168
(Patent Document 4) WO No. 2004/077886
(Patent Document 5) JP-A No. 2004-6165
(Non-Patent Document 1) M. A. Baldo et al., Nature, Volume 395, pages 151-154 (1998)
(Non-Patent Document 2) M. A. Baldo et al., Nature, Volume 403, No. 17, pages 750-753 (2000)

SUMMARY

In view of the above problems and situations, the present invention was achieved. An object of the present invention is to provide a white light emitting electroluminescent element which exhibits excellent electric power efficiency, excellent temporal stability of emitted light chromaticity during continuous drive, and excellent stability of emitted light chromaticity against variation in driving electric current, and a lighting apparatus employing the same.

The above problems were solved via the following embodiments.

1. One of the embodiments of the present invention is a white light-emitting organic electroluminescent element comprising a substrate having thereon:
   an anode;
   a cathode; and
   a plurality of light emitting layers between the anode and the cathode,
   wherein the plurality of light emitting layers comprises:
   a first light emitting layer which emits a light having a predetermined wavelength;
   a second light emitting layer which is located at a nearer position to the anode than the first light emitting layer and emits a light having a complementary color to the light having the predetermined wavelength; and
   a third light emitting layer which is located at a nearer position to the cathode than the first light emitting layer and emits the light having the complementary color to the light having the predetermined wavelength.

2. Another embodiment of the present invention is a white light-emitting organic electroluminescent element, wherein one of the first light emitting layer, the second light emitting layer and the third light emitting layer is a blue light emitting layer which emits a light having a maximum luminescent wavelength of 480 nm or less.

3. Another embodiment of the present invention is a white light-emitting organic electroluminescent element, wherein each of the second light emitting layer and the third light emitting layer comprises:
   a green light-emitting material which emits a light having a maximum luminescent wavelength of 510-570 nm; and
   a red light-emitting material which emits a light having a maximum luminescent wavelength of 590-650 nm.

4. Another embodiment of the present invention is a white light-emitting organic electroluminescent element, wherein at least two of the first light emitting layer, the second light emitting layer and the third light emitting layer comprise a host compound having the same chemical structure.

5. Another embodiment of the present invention is a lighting device comprising the white light-emitting organic electroluminescent element of the above-described item 1.

Based on the above embodiments of the present invention, it is possible to provide a white light emitting electroluminescent element which exhibits excellent electric power efficiency, excellent temporal stability of emitted light chromaticity during continuous drive, and excellent stability of emitted light chromaticity against variation of driving electric current, and a lighting apparatus employing the same.

In addition, in practice, it is possible to provide a white light emitting organic electroluminescent element which tends not to result in an uncomfortable feeling due to chromaticity variation in such a manner that during continuous drive and variation of the driving electric current, the emitted light chromaticity results in variation mostly along the blackbody locus.

DESCRIPTION OF THE PREFERRED EMBODIMENT

Figure 1:
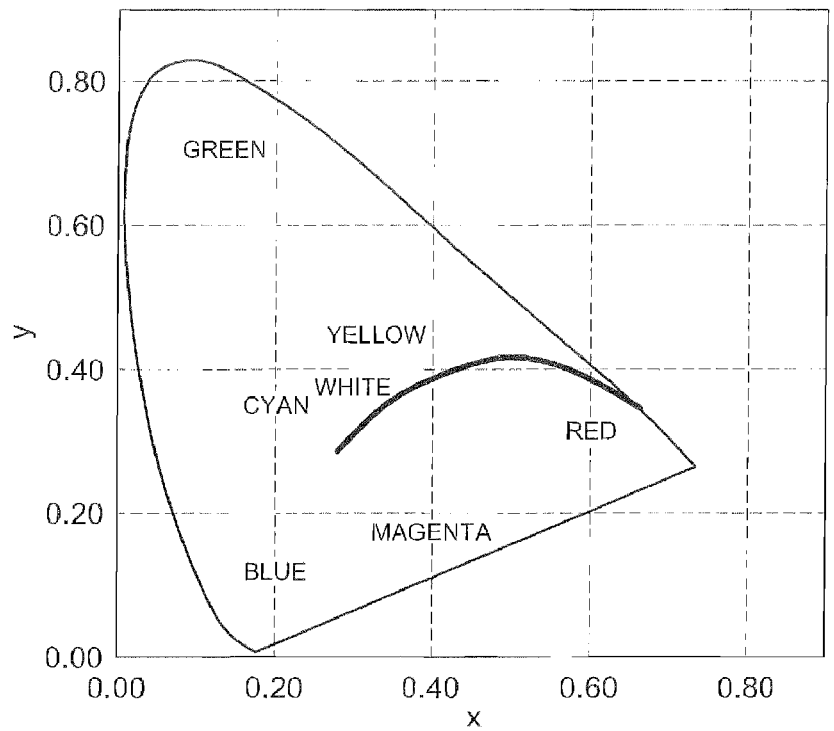
FIG. 1 is a schematic view showing the relationship of a blackbody locus, each color, and complementary colors.

The white light emitting electroluminescent element of the present invention is characterized in the following constitution. It incorporates a substrate having thereon at least an anode, a cathode, and a plurality of light emitting layers between the above anode and the above cathode, and a plurality of the above light emitting layers which is composed of at least three layers including a first light emitting layer which emits the specified color of light having a predetermined wavelength, a second light emitting layer which is positioned on the above anode side with respect to the above first layer and emits light which is in the relationship of a complementary color, and a third light emitting layer which is positioned on the above cathode side with respect to the above first layer and emits light which is in the relationship of a complementary color with respect to the above specified color. The above characteristics are technical ones which are common to the invention according to above described items 1.-5.

In the present application, "complementary color relationship" refers to the mutual color relationship in which when colors are mixed, achromatic color results. Namely, when light emitted by a material which emits color in the relationship of achromatic color, white light is obtainable. Namely, "complementary color", as described in the present application refers to the complementary color of additive color mixing. It is preferable that in the CIE 1931 xy chromaticity diagram, the straight line passing the chromaticity point of the light of the specified color emitted by the above first light emitting layer and the chromaticity point of the light of the color emitted by the above second light emitting layer, and the straight line passing the chromaticity point of the light of the specified color emitted by the above first light emitting layer exist across the white light region, and the chromaticity point of the light of the color emitted by the above third light emitting layer exist across the region enclosed by an x value of 0.37±0.1 and a y value of 0.37±0.07 in the CIE 1931 chromaticity diagram. In practice, the chromaticity of preferred white light is described below.

(Preferred Embodiment of White Light Emitting Organic Electroluminescent Element of the Present Invention)

The preferred embodiment of the present invention is such that any of the above first, second, or third layers is a layer emitting blue light at a maximum wavelength of the emitted light of at most 480 nm.

Further, with respect to the above layer emitting a blue light at a maximum wavelength of at most 480 nm, it is preferable that a layer emitting the light which is in the above complementary color relationship incorporates materials which emit green light at a maximum wavelength of 510-570 nm and materials which emit red light at a maximum wavelength of 590-650 nm.

In addition, it is preferable that at least two layers of the three light emitting layers, including the above first, second and third layers, incorporate the same host compounds.

The present invention and its constituting elements will now be detailed.

<<Color of Emitted Light and Front Luminance of White Light Emitting Organic Electroluminescent Elements>>

Color of light emitted from the white light emitting organic electroluminescent element of the present invention and chemical compounds related to the above element is determined via spectral radiation luminance meter CS-1000 (produced by Konica Minolta Sensing, Inc.) shown in FIG. 4.16 of page 108 of "Shinhen Shikisai Kagaku Handbook (Newly Edited Color Science Handbook" (edited by Nihon Shikisai Gakkai, published by Tokyo Daigaku Shuppan Kai, 1985), and the determined results are plotted onto the CIE chromaticity diagram, whereby color is determined.

Preferred chromaticity as the white light emitting organic electroluminescent element in the present invention is in the region at an x value of 0.37±0.1 and a y value of 0.37±0.07.

<<Layer Configuration of White Light Emitting Organic Electroluminescent Element>>

Subsequently listed are preferred specific examples of the layer configuration of the white light emitting organic electroluminescent element of the present invention, however the present invention is not limited thereto.

(i) Anode/light emitting layer unit/electron transporting layer/cathode
(ii) Anode/positive hole transporting layer/light emitting layer unit/electron transporting layer/cathode
(iii) Anode/positive hole transporting layer/light emitting layer unit/positive hole inhibiting layer/electron transporting layer/cathode
(iv) Anode/positive hole transporting layer/light emitting layer unit/positive hole blocking layer/electron transporting layer/cathode buffer layer/cathode
(v) Anode/anode buffer layer/positive hole transporting layer/light emitting layer unit/positive hole blocking layer/electron transporting layer/cathode buffer layer/cathode The white light emitting organic electroluminescent element of the present invention is characterized in that at least three light emitting layers are incorporated.

<<Light Emitting Layer>>

The light emitting layer according to the present invention is one which emits light via recombination of electrons and positive holes from the electrode, or via the electron transporting layer or the positive hole transporting layer into which they are injected, and the light emitting portion may be in the interior of the light emitting layer or at the interface between the light emitting layer and an adjacent layer.

In the white light emitting electroluminescent element according to the present invention, the following constitution is characterized. It incorporates a substrate having thereon at least an anode, a cathode, and a plurality of light emitting layers between the above anode and the above cathode, and a plurality of the above light emitting layers is composed of at least three layers including a first light emitting layer which emits the specified color of light, a second light emitting layer which is positioned on the above anode side with respect to the above first layer and emits light which is in the relationship of the complementary color, and a third light emitting layer which is positioned on the above cathode side with respect to the above first layer and emits light which is in the relationship of the complementary color with respect to the above specified color. It is possible to apply to the above second and third light emitting layers a layer having the same composition. Furthers a non-light emitting interlayer may be incorporated between each of the light emitting layers.

In the present invention, each of the second and third light emitting layers is arranged on the above anode and cathode sides, respectively, with respect to the first light emitting layer, which emits light of a color in the complementary color relationship with the specified color of light emitted by the above first light emitting layer, whereby when the electric current density of the driving electric current varies, the central light emitting position in the above first light emitting layer shifts, and the light emitting center shifts toward the above second light emitting layer, or shifts to the above third central light emitting layer, the above second and third light emitting layers emit light of a color in the complementary relationship with the color of the light emitted by the above first layer. Consequently, in the 1931 xy chromaticity diagram, decided by CIE (International Commission on Illumination), it is possible to regulate, to some extent, the chromaticity on the straight line passing the color of the emitted light and the complementary color, resulting in ease of regulating the chromaticity from the above first layer. In addition, when the above first light emitting layer emits blue light, the above second and third light emitting layers emit of light yellow which is the complementary color of blue. Consequently, the straight line passing through blue and yellow approaches the blackbody locus, whereby even though the resulting chromaticity is not strictly regulated, it is possible to minimize uncomfortable feeling due to chromaticity changes. These relationships are shown in FIG. 1, employing the CIE 1931 xy Chromaticity Diagram. In FIG. 1, the wide line represents the blackbody locus.

In the present invention, it is preferable that at least one of the above first, second, and third layers is a layer emitting blue light at a maximum wavelength of at most 480 nm.

Further, in the present invention, it is preferable that a layer which emits light of a color in the relationship of the complimentary color, with respect to the layer emitting light of blue at a maximum wavelength of at most 480 nm, incorporates at least one material emitting green light at a maximum wavelength of 510-570 nm and at least one material emitting green light at a maximum wavelength of 590-650 nm.

The constitution of the light emitting layer according to the present invention is not particularly limited as long as it meets the requirements specified in the present invention. Further, when there are three or more light emitting layers there may be a plurality of layers which emit light of similar spectra and maximum wavelength.

The total thickness of light emitting layers is not particularly limited. In view of homogeneous quality of formed films, prevention of unnecessary high voltage application during light emission, and enhancement of stability of the color of emitted light to driving electric current, the total thickness is regulated to be in the range of preferably 2-200 nm, but more preferably 5-40 nm. Further, the thickness of each of the light emitting layers is regulated in the range of preferably 2-100 nm, but more preferably 5-30 nm.

Methods for forming light emitting layers are as follows. It is possible firstly to form the layer by applying the light emitting dopants or host compounds onto a substrate, employing conventional thin-film forming methods such as a vacuum deposition method, a spin coating method, a casting method, an LB method (the Langmuir-Blodgett method), or an ink-jet method.

Secondly, light emitting dopants (hereinafter also referred to as light emitting dopant compounds) and host compounds incorporated in the light emitting layer will be described.

(Light Emitting Dopants)

As light emitting dopants according to the present invention employed may be fluorescent compounds, phosphorescence emitting materials (hereinafter also referred to as phosphorescent compounds and phosphorescence emitting compounds). However, in view of preparing organic EL elements of higher light emitting efficiency, it is preferable that phosphorescence emitting materials are incorporated as a light emitting dopant employed in the light emitting layer of the organic EL element of the present invention, and it is more preferable that all light emitting dopants incorporated in the element are phosphorescence emitting materials.

(Phosphorescence Emitting Materials)

The phosphorescence emitting materials according to the present invention are defined in such a manner that light emission is observed from the excited triplet, and specifically, compounds emit phosphorescence at room temperature (25° C.), while the phosphorescent quantum yield is at least 0.01 at 25° C. The phosphorescent quantum yield is preferably at least 0.1.

It is possible to determine the above phosphorescent quantum yield by employing, for example, the methods described on page 398 of Bunkco (Spectroscopy) II of Dai 4 Han Jikken Kagaku Koza (4th Edition Experimental Chemistry Lectures) (1992 Edition, Maruzen). It is possible to determine the phosphorescent quantum yield in a solution by employing various solvents, and the phosphorescence emitting materials according to the present invention are acceptable when the above phosphorescent quantum yield (at least 0.01) is achieved in any of the solvents.

As a light emitting principle of phosphorescence emitting materials, two types are listed. Namely, one type is an energy transfer type in which recombination of carriers occurs on the host compounds onto which the above carries are transported, resulting in formation of the excited state of the above host compounds, and light emission is generated by transferring the above energy to the phosphorescence emitting materials, while the other type is a carrier trap type in which phosphorescence emitting materials function as a carrier trop, resulting in recombination of the carriers in the phosphorescence emitting materials and light emission is generated from the phosphorescence emitting materials. In either case, the condition should be that energy of the excited state of phosphorescence emitting materials is lower than that of the host compounds.

The phosphorescence emitting materials according to the present invention are complex based compounds which incorporate preferably metals in Groups 8-10 of the element periodic table, more preferably iridium compounds, osmium compounds, platinum compounds (platinum complex based compounds), and rare earth metal complexes, and of these, most preferred are iridium compounds.

As phosphorescence emitting materials, employed may those which are selected from the conventional compounds employed in the light emitting layer of the organic EL elements. It is preferable that in a blue light emitting layer, the phosphorescence emitting materials of a maximum wavelength of the emitted light of at most 480 nm are employed which are represented by following Formula (1).

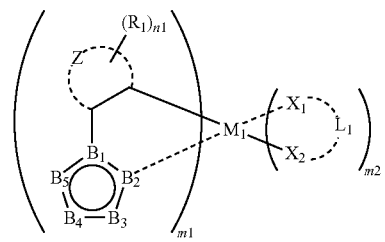

Formula (1)

wherein $R_1$ represents a substituent; Z represents a group of non-metallic atoms which are necessary to form a 5-7 membered ring; n1 represents in integer of 0-; $B_1$-$B_5$ each represents a carbon atom, a nitrogen atom, an oxygen atom, or a sulfur atom, while at least one of $B_1$-$B_5$ represents a nitrogen atom; $M_1$ represents a metal in Groups 8-10 of the element periodic table; each of $X_1$ and $X_2$ represents a carbon atom, a nitrogen atom, or an oxygen atom; $L_1$ represents a group of atoms which form a bidentate ligand together with $X_1$ and $X_2$; m1 represents an integer of 1, 2, or 3; and m2 represents an integer of 0, 1, or 2, while m1+m2 is 2 or 3.

The phosphorescence emitting materials (hereinafter also referred to as phosphorescence emitting dopants) will now be detailed.

<<Phosphorescence Emitting Compounds Represented by Formula (1)>>

In the phosphorescent compounds represented by above Formula (1) according to the present invention, examples of the substituents represented by $R_1$ include an alkyl group (for example, a methyl group, an ethyl group, a propyl group, an isopropyl group, a tert-butyl group, a pentyl group, a hexyl group, an octyl group, a decyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also called as an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenatolyl group, an indenyl group, a pyrenyl group, and a biphenyryl group), an aromatic heterocyclic ring group (for example, a pyridyl group, a pyrimidinyl group, a furyl group, a pyrrolyl group, an imidazolyl group, a benzimidazolyl group, a pyrazolyl group, a pyrazinyl group, a triazolyl group (for example, a 1,2,4-triazole-1-yl group, a 1,2,3-triazole-1-yl group), an oxazolyl group, a benzoxazolyl group, a thiazolyl group, an isooxazolyl group, anisothiazolyl group, a frazanyl group, a thienyl group, a quinolyl group, a benzofuryl group, a dibenzofuryl group, a benzothienyl group, a dibenzothienyl group, an indolyl group, a carbazolyl group, a carbonyl group, a diazacabazolyl group (being a group in which one of the carbon atoms which constitute the carboline ring of the above carbolynyl group is replaced with a nitrogen atom), a quinoxalynyl group, a pyridadinyl group, a triazinyl group, a quinazolynyl group, and a phthaladinyl group), a heterocyclyl group (for example, a pyrrolidyl group, an imidazolydyl group, a morpholyl group, and an oxazolydyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), an ureido group (for example, a methylureido group, an ethylureido group, a pentylureido gropup, a cyclohexylureido group, an octylureido group, a dodecylureido group, a phenylureido group, a naphthylureido group, and a 2-pyridylureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butyl sulfonyl group, a cyclohexylsulfonyl group, a 2-ethylhexylsulfonyl group, and a dodecylsulfonyl group), an arylsulfonyl group or heteroarylsulfonyl group (for example, a phenylsulfonyl group, a naphthylsulfonyl group, a 2-pyridylsulfonyl group, an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a cyano group, a nitro group, a hydroxyl group, a mercapto group, and a silyl group (for example, a trimethylsilyl group, a triisopropylsilyl group, a triphenylsilyl group, and a phenyldiethylsilyl group).

Of these substituents, preferred is the alkyl or aryl group.

Z represents a group of non-metallic atoms which are necessary to form a 5- to 7-membered ring. Examples of the 5- to 7-membered rings formed via Z include a benzene ring, a naphthalene ring, a pyridine ring, a pyrimidines ring, a pyrrole ring, a thiophene ring, a pyrazole ring, an imidazole ring, an oxazole ring, and a thiazole ring. Of these, preferred is the benzene ring.

$B_1$-$B_5$ each represents a nitrogen atom, an oxygen atom, or a sulfur atom, while at least one of them represents the nitrogen atom. A single ring is preferred as the aromatic nitrogen-containing heterocyclic ring which is composed of these 5 atoms. Examples thereof include a pyrrole ring, a pyrazole ring, an imidazole ring, a triazole ring, a tetrazole ring, an oxazole ring, an isooxazole ring, a thiazole ring, an oxadiazole ring, and a thiadiazole ring. Of these, preferred are the pyrazole ring and the imidazole ring, and more preferred is the imidazole ring. These rings may be substituted with any of the above substituents. The alkyl group and the aryl group are preferred as the above substituent and the aryl group is more preferred.

$L_1$ represents a group of atoms which form a bidentate ligand together with $X_1$ and $X_2$. Specific examples of the bidentate ligands represented by $X_1$-$L_1$-$X_2$ include a substituted or unsubstituted phenylpyridine, phenylpyrazole, phenylimidazole, phenyltriazole, phenyltetrazole, pyrazabole, picolinic acid, and acetylacetone.

These substituents may be substituted with any of the above substituents.

"m1" represents an integer of 1, 2, or 3, and m2 represents an integer of 0, 1, or 2, while m1+m2 equal 2 or 3. Of these, the case in which m2 represents 0 is preferred.

As the metals represented by M1 employed may be transition metals of Groups 8-10 in the element periodic table. Of these, iridium and platinum are preferred, while iridium is more preferred.

The phosphorescence emitting compounds represented by Formula (1) may have neither a polymerizable group nor a reactive group.

Further, in above Formula (1), it is preferable that the nitrogen-containing heterocyclic ring formed by $B_1$-$B_5$ is an imidazole ring.

Still further, when the nitrogen-containing heterocyclic ring formed by $B_1$-$B_6$ is an imidazole ring, it is preferable that above Formula (1) is represented by following Formula (2).

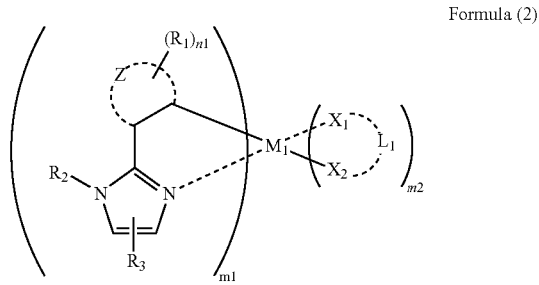

Formula (2)

In above Formula (2), $R_1$, $R_2$, and $R_3$ each represents a substituent; Z represents a group of non-metallic atoms which are necessary to form a 5- to 7-membered ring; each of $X_1$ and $X_2$ represents a carbon atom, a nitrogen atom, or an oxygen atom; $L_1$ represents a group of atoms which form a bidentate ligand together with $X_1$ and $X_2$; m1 represents an integer of 1, 2, or 3; and m2 represents an integer of 0, 1, or 2, while m1+m2 equal 2 or 3.

In Formula (2), the substituent represented by $R_1$, $R_2$, or $R_3$ is as defined for the substituent represented by $R_1$ in above Formula (1); further, each of Z, $M_1$, $X_1$, $X_2$, and $L_2$ is also as defined for each in above Formula (1); and each of m1 and m2 is as defined above.

Further, preferred as the group represented by $R_2$ in Formula (2) is any one of the aromatic hydrocarbon ring groups (being aromatic carbon rings). Of these, a substituted aryl group is preferred, and preferred as the substituted aryl group is the group represented by following Formula (3).

Formula (3)

In Formula (3), $R_4$ represents a substituent which exhibits a steric parameter value (being an Es value) and is at most −0.5. $R_5$ is the same as $R_1$, while n5 represents an integer of 0-4. Incidentally, "*" represents the bonding position.

"Es value", as described herein, is a steric parameter which is derived from chemical reactivity. It is possible to state that the smaller this value, the more three-dimensionally bulky the substituent is.

The Es value will now be described. In the hydrolysis reaction of ester in an acidic condition, it is known that it is sufficient to consider only steric hindrance of a substituent for its effects on the reaction progress.

For example, the Es value of substituent X is determined by the following formula.

$Es = \log(kX/kH)$

In the above formula, kX represents a reaction rate constant during hydrolysis under an acidic condition, as shown in the following reaction formula, of α-position monosubstituted acetic acid ester derived from α-position monosubstituted acetic acid, which is prepared by substituting the methyl group of acetic acid with substituent X; X—$CH_2COOR_X$+ $H_2O \rightarrow$ X—$CH_2COOH$+$R_XOH$, while kH represents a reaction rate constant during hydrolysis under an acidic condition, as shown in the following reaction formula, of the acetic acid ester which corresponds to the above α-position monosubstituted acetic acid ester; $CH_3COOR_Y$+$H_2O \rightarrow CH_3COOH$+ $R_YOH$ ($R_X$ is the same as $R_Y$). The reaction rate decreases with increasing the steric hindrance of the substituent X. As a result, kX is smaller than kH, which means that Es values are always negative values. Es values can be obtained from experimental values of kX and kH as describe above.

Specific examples of the Fs values are detailed in Unger, S. H. and Hansch, C., Prog. Phys. Org. Chem., 12, 91 (1976). Further, specific numeral values are listed in "Yakubutsu no Kozo Kassei Sokan (Structure Active Correlation of Medicines)" (Kagaku no Ryoiki Zokan No. 122, Nankodo), and "American Chemical Society Professional Reference Book, 'Exploring QSAR' p. 81 Table 3-3". Some of these will be listed in Table 1.

TABLE 1

| Substituent | Es Value | Substituent | Es Value |
|---|---|---|---|
| H | 0 | $CH_2OCH_3$ | −1.43 |
| F | −0.46 | $CH_2NO_2$ | −2.71 |
| Cl | −0.97 | $CH_2COCH_3$ | −1.99 |
| Br | −1.16 | $CHF_2$ | −1.91 |
| I | −1.4 | $CHCl_2$ | −2.78 |
| $CH_3$ | −1.24 | $CHBr_2$ | −3.1 |
| $C_2H_5$ | −1.31 | $CHOHCH_3$ | −1.15 |
| n-$C_3H_7$ | −1.6 | $CF_3$ | −2.4 |
| n-$C_4H_9$ | −1.63 | $CCl_3$ | −3.3 |
| i-$C_4H_9$ | −2.17 | $CBr_3$ | −3.67 |
| s-$C_4H_9$ | −2.37 | $C(C_6H_5)_3$ | −5.92 |
| t-$C_4H_9$ | −2.78 | $CHCH_3$ | −2.84 |
| cyclo-$C_4H_7$ | −1.3 | CN | −0.51 |
| n-$C_5H_{11}$ | −1.64 | OH | −0.55 |
| i-$C_5H_{11}$ | −1.59 | $OCH_3$ | −0.55 |
| $CH(C_2H_5)$ | −3.22 | SH | −1.07 |
| cyclo-$C_6H_{11}$ | −2.03 | $SCH_3$ | −1.07 |
| $CH_2F$ | −1.48 | $SF_5$ | −2.91 |
| $CH_2Cl$ | −1.48 | $NH_2$ | −0.61 |
| $CH_2Br$ | −1.51 | | |
| $CH_2I$ | −1.61 | | |
| $CH_2OH$ | −1.21 | | |

It should be noted that Es values defined in the present invention are obtained as follows. The Es value of a methyl group is not defined as "0", but that of a hydrogen atom is defined as "0". The Es value of the present invention is obtained by subtracting 1.24 from the Es value when the Es value of a methyl group is "0".

In the present, $R_4$ represents a substituent which exhibits a steric parameter value (an Es value) of at most −0.5, preferably −7.0 to −0.6, but more preferably −7.0--1.0.

Further, in the present invention, when it is possible that, for example, keto-enol tautomers are present in $R_4$, the Es value of the keto portion is converted as the enol tautomer. When other tautomers exist, the Es value is obtained via the same conversion method.

Specific examples of the phosphorescence emitting compounds represented by Formula (1) or (2) of the present invention will now be listed, however the present invention is not limited thereto.

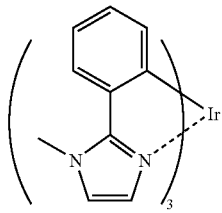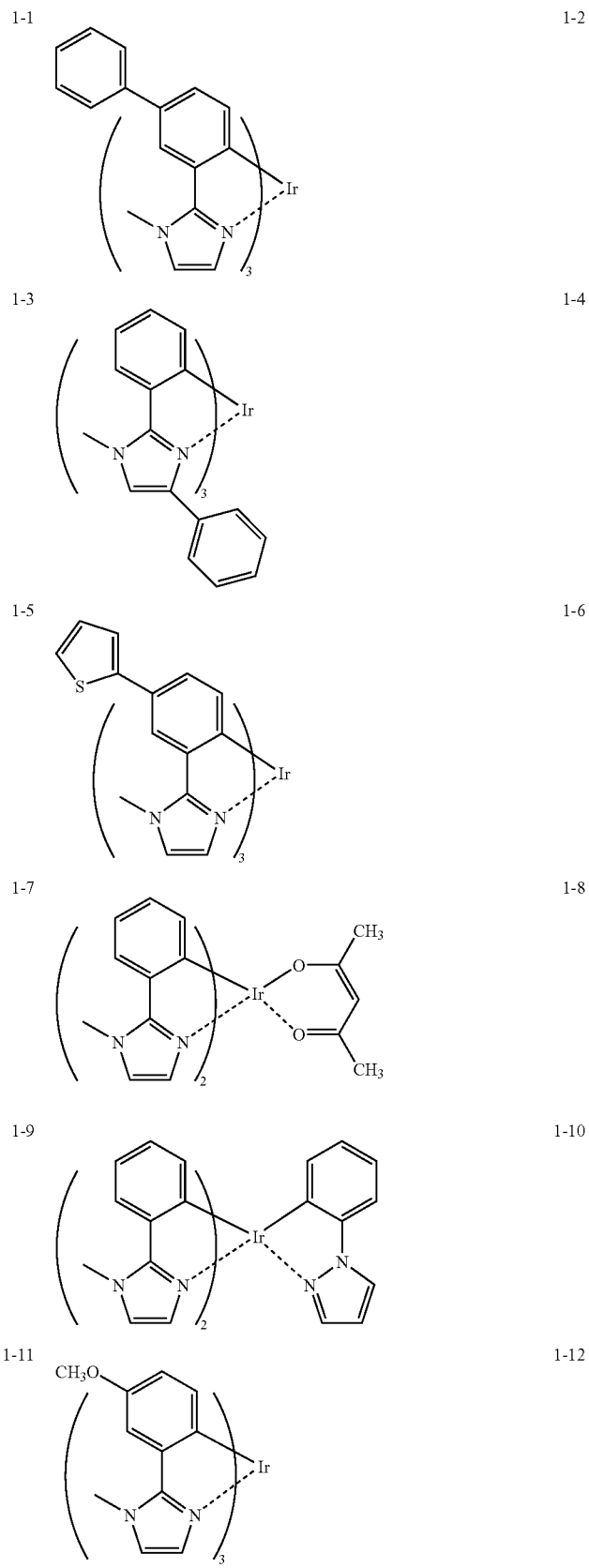

-continued
1-13
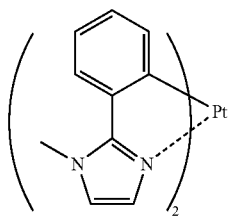
1-14
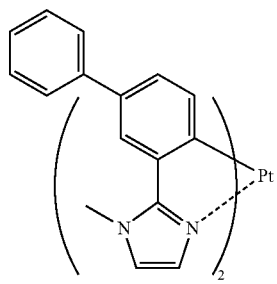
1-15
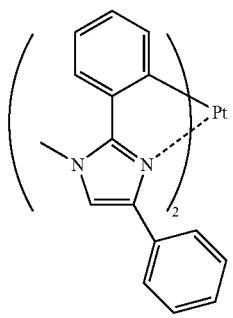
1-16
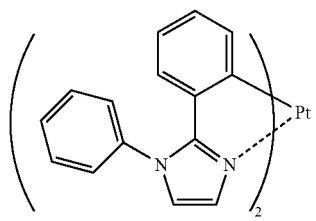
1-17
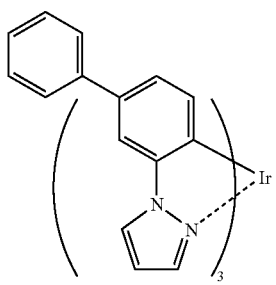
1-18
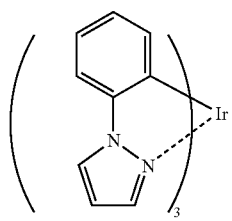
1-19
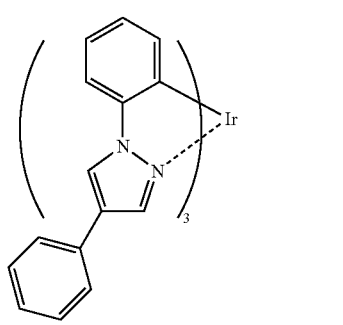
1-20
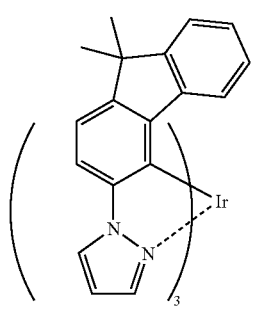
1-21
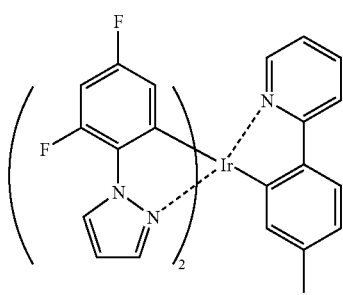
1-22
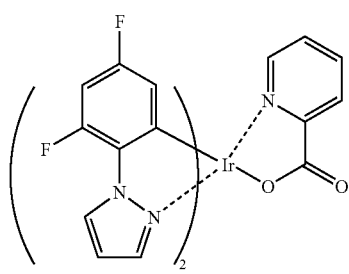

-continued
1-23
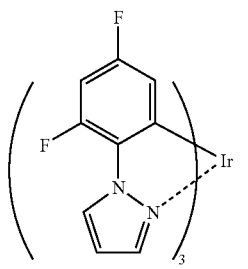
1-24
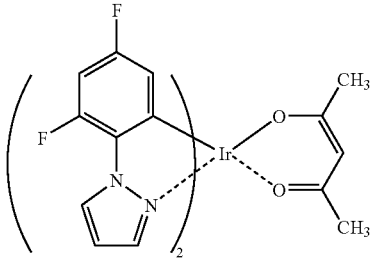
1-25
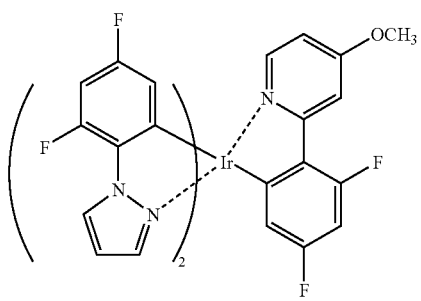
1-26
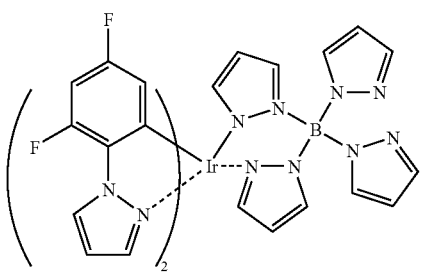
1-27
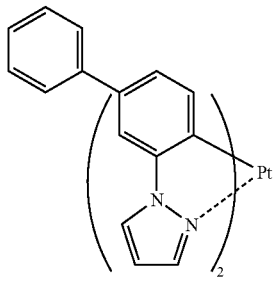
1-28
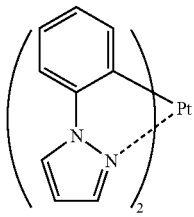
1-29
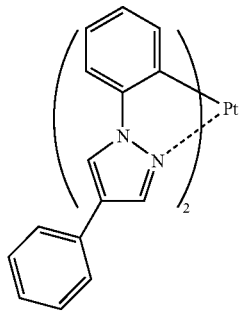
1-30
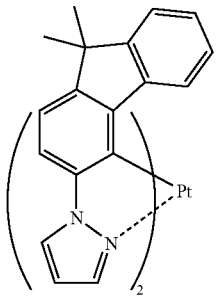
1-31
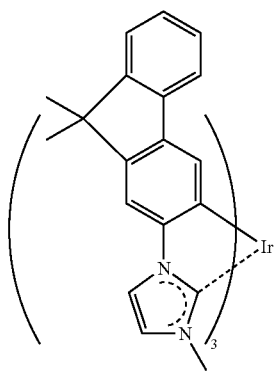
1-32
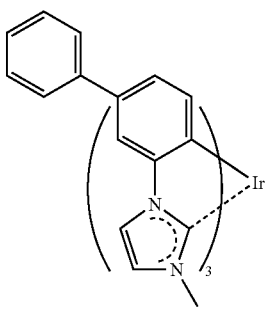

-continued
1-33
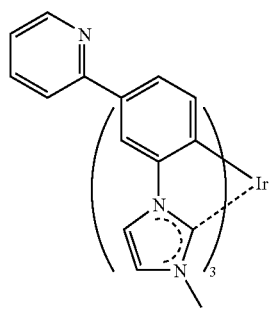
1-34
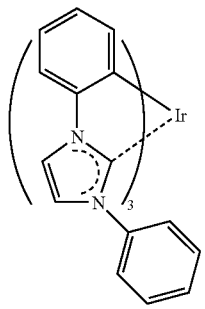
1-35
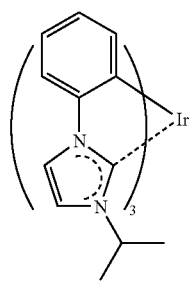
1-36
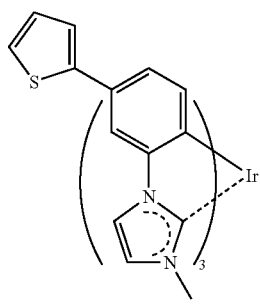
1-37
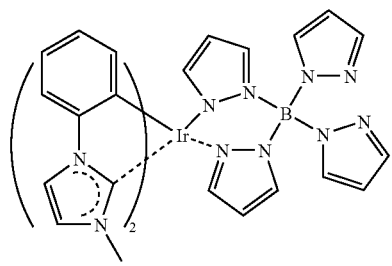
1-38
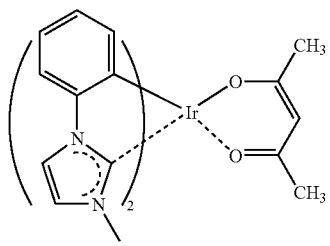
1-39
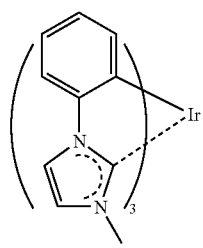
1-40
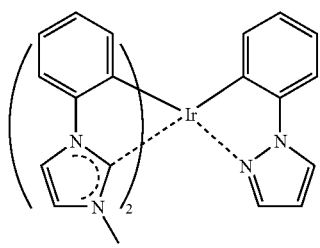
1-41
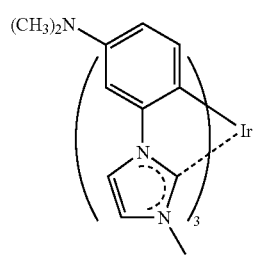
1-42
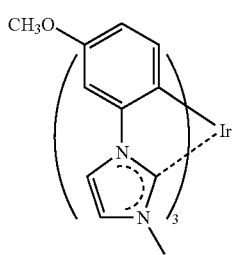

-continued
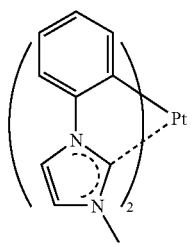
1-43
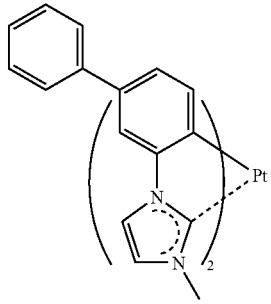
1-44
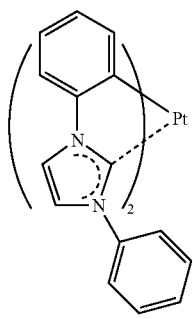
1-45
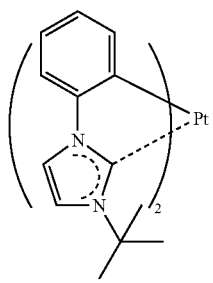
1-46
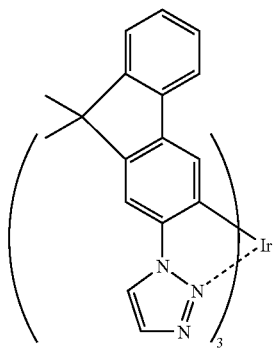
1-47
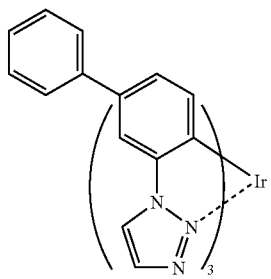
1-48
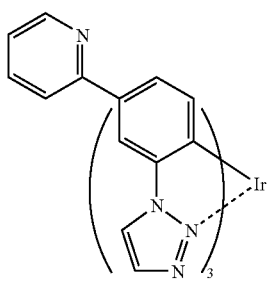
1-49
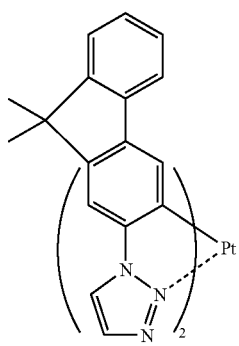
1-50

-continued
1-51
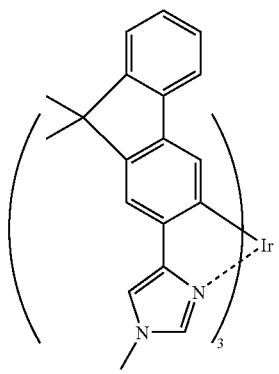
1-52
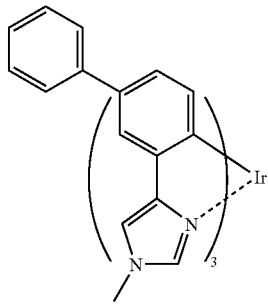
1-53
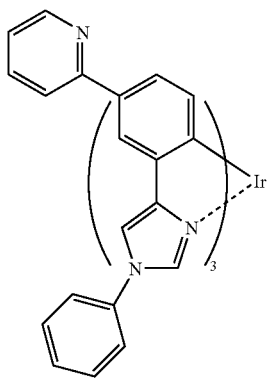
1-54
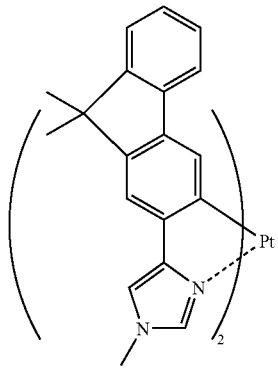
1-55
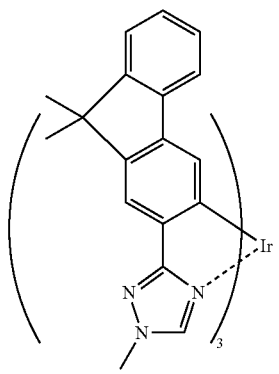
1-56
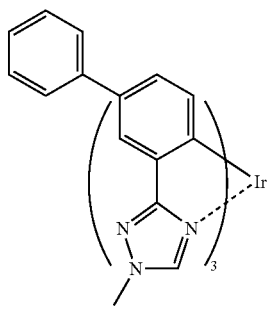
1-57
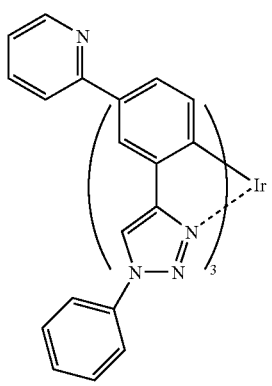
1-58
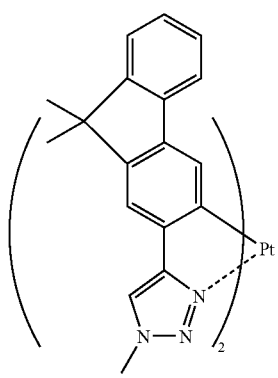

-continued
1-59
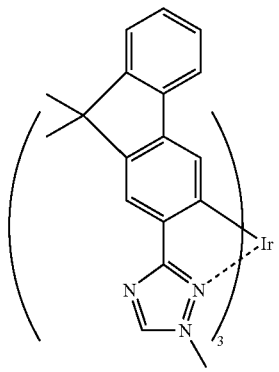
1-60
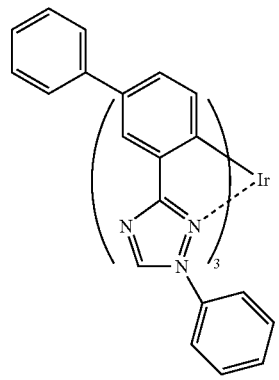
1-61
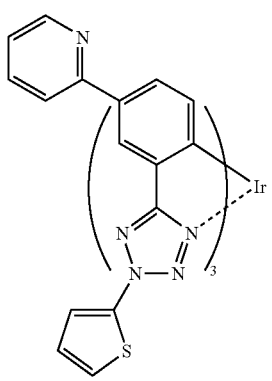
1-62
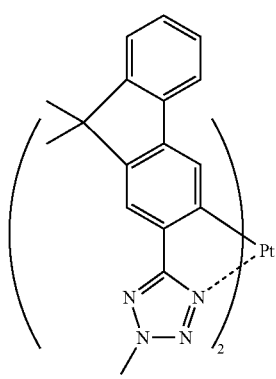
1-63
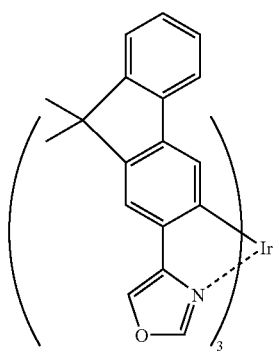
1-64
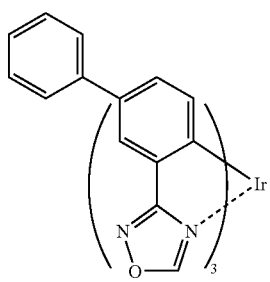
1-65
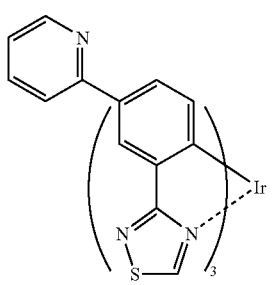
1-66
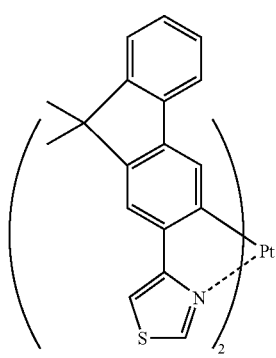

-continued
1-67
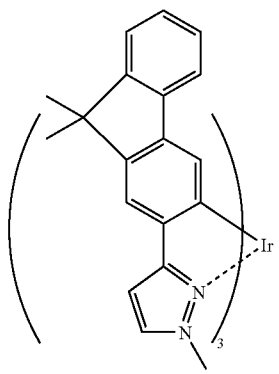
1-68
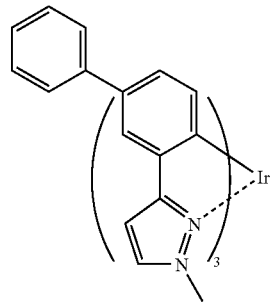
1-69
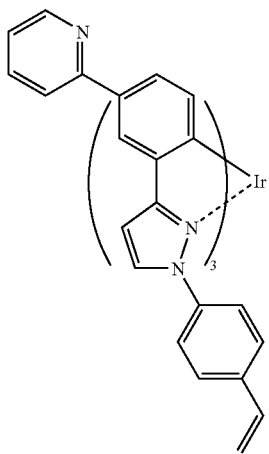
1-70
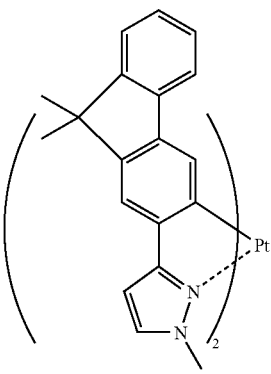
1-71
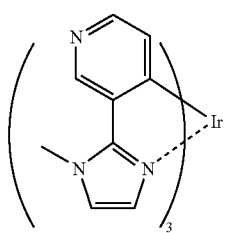
1-72
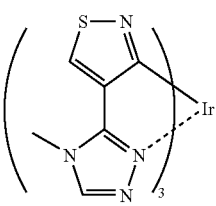
1-73
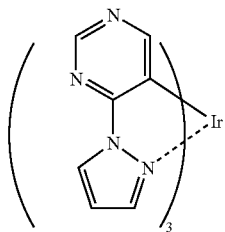
1-74
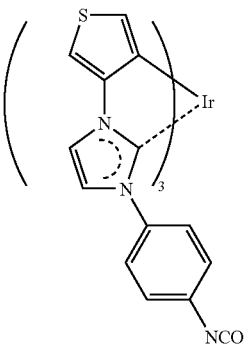

-continued
1-75
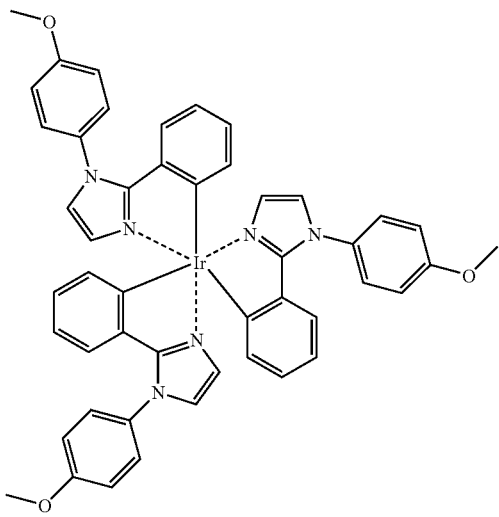
1-76
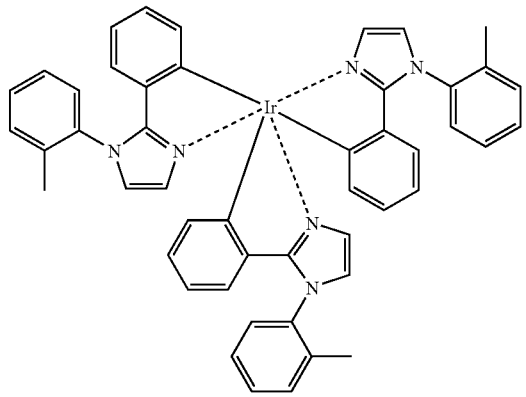
1-77
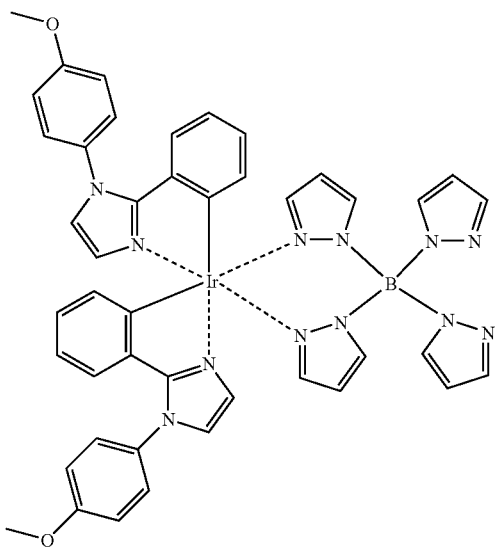
1-78
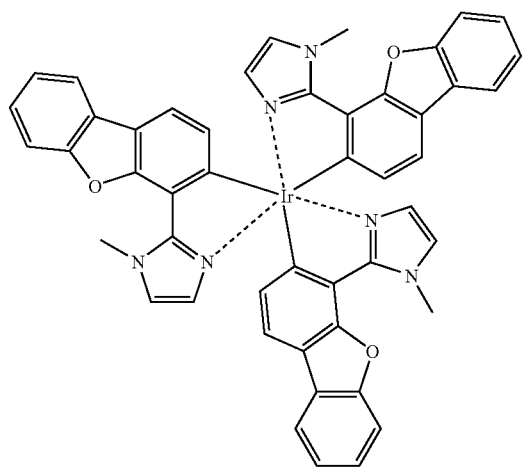
1-79
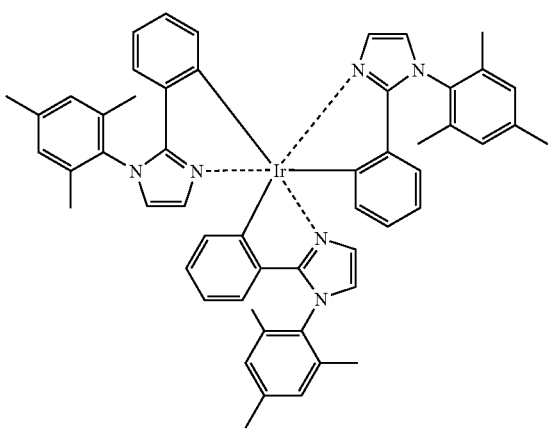
1-80
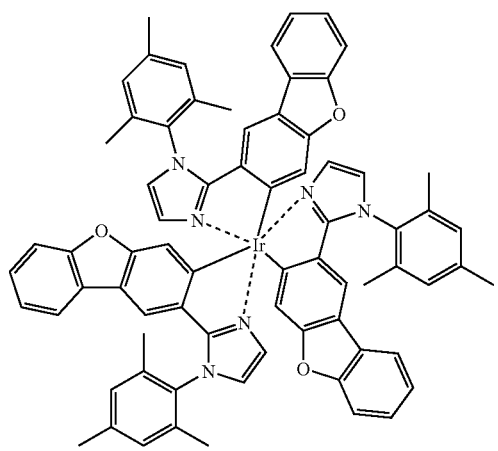

-continued
1-81
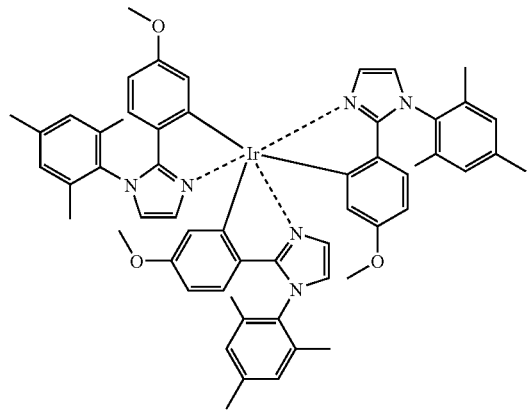
1-82
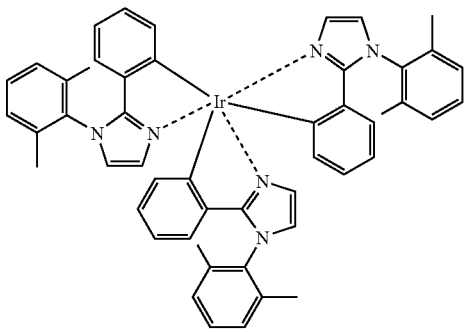
1-83
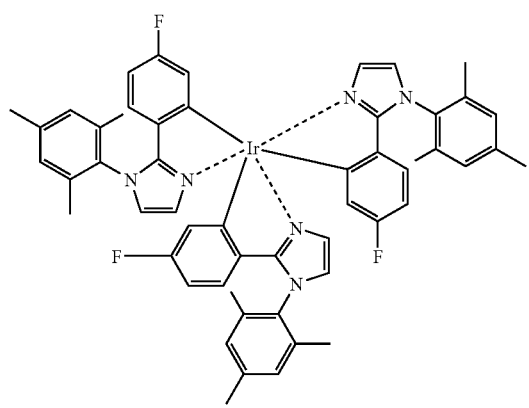
1-84
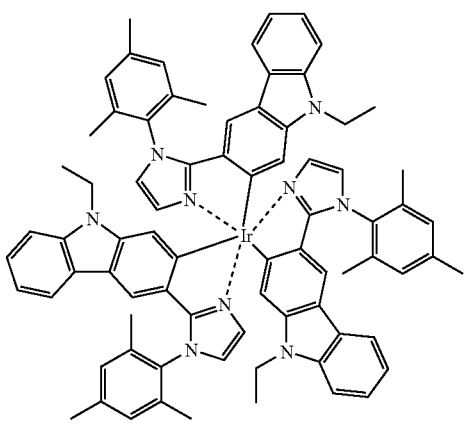
1-85
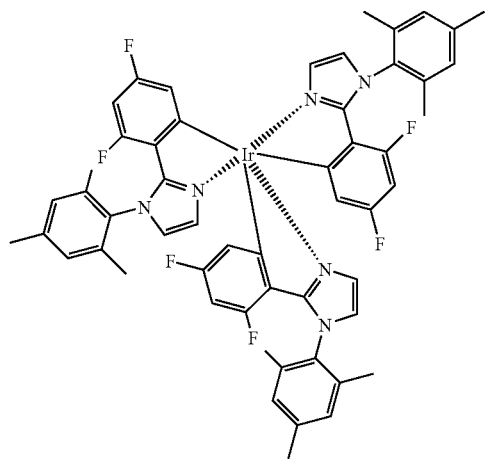
1-86
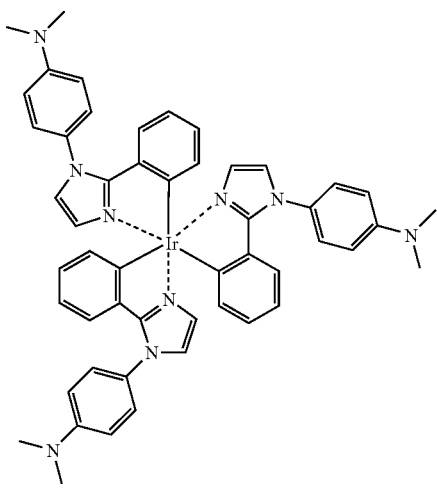

-continued
1-87
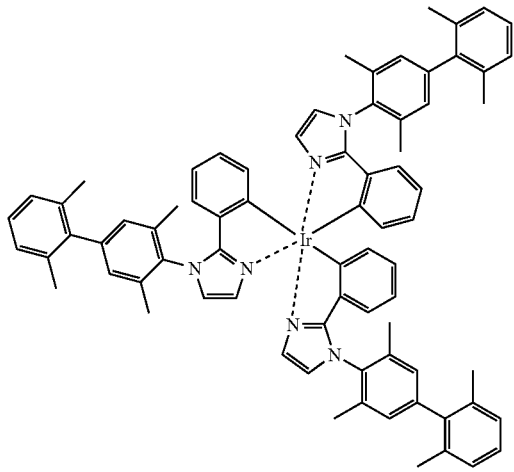
1-88
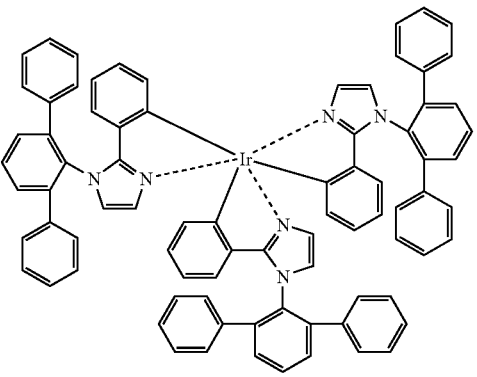
1-89
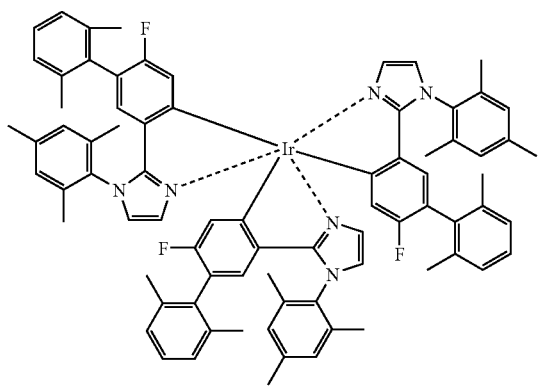
1-90
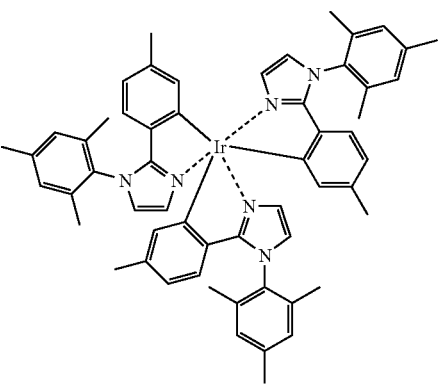
1-91
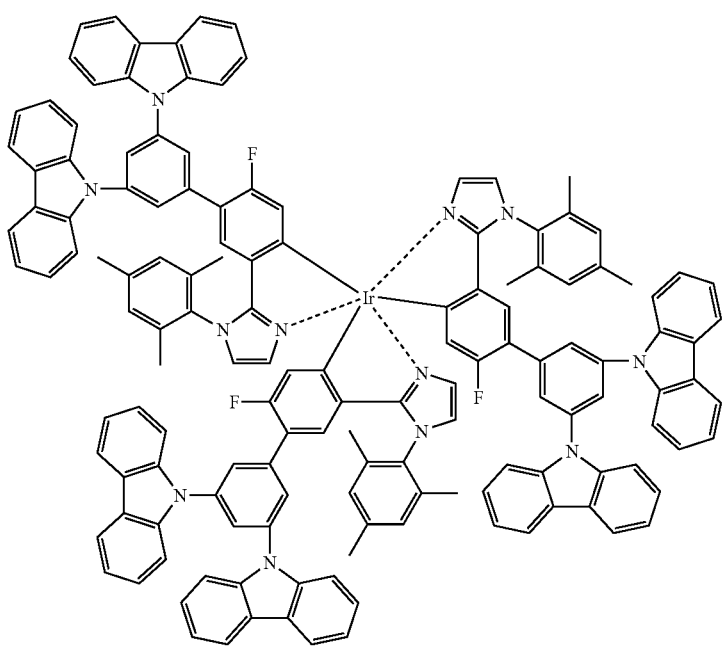

-continued
1-92
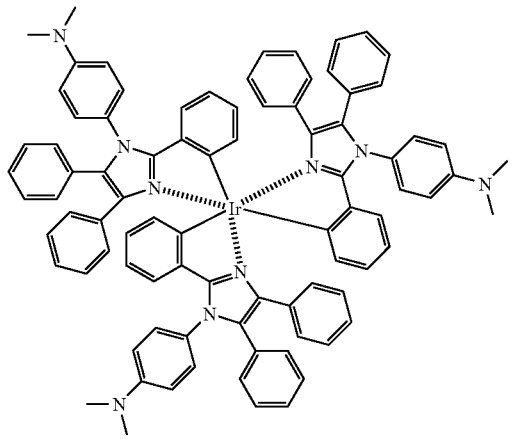
1-93
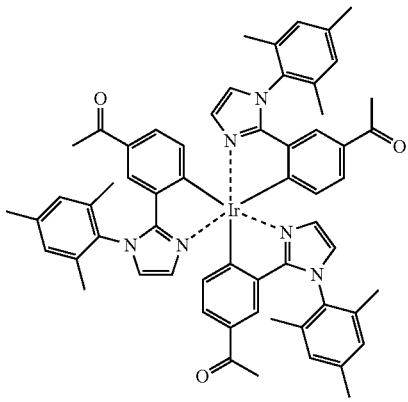
1-94
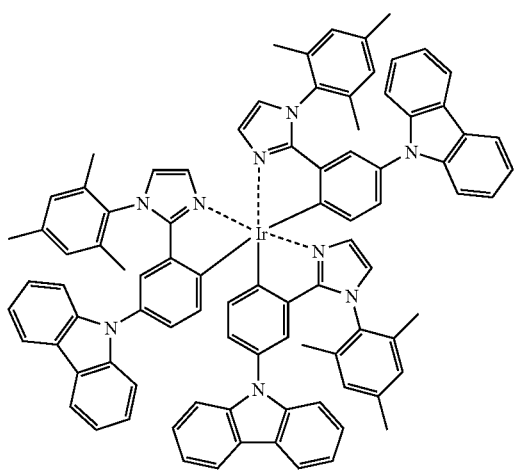
1-95
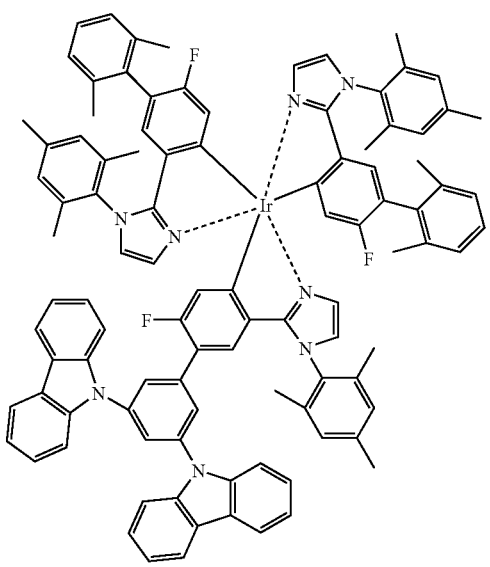
1-96
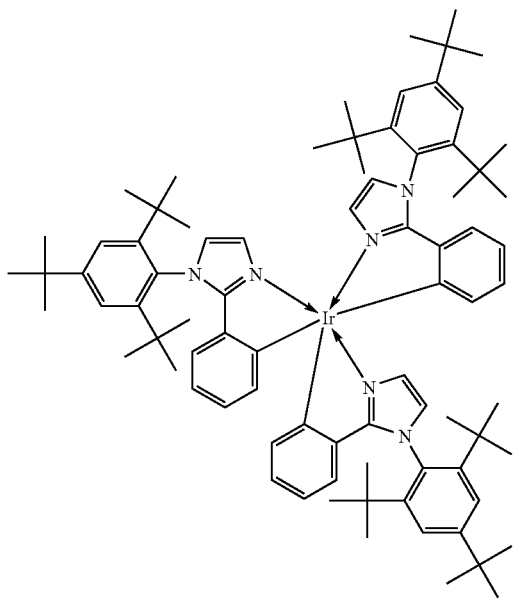
1-97
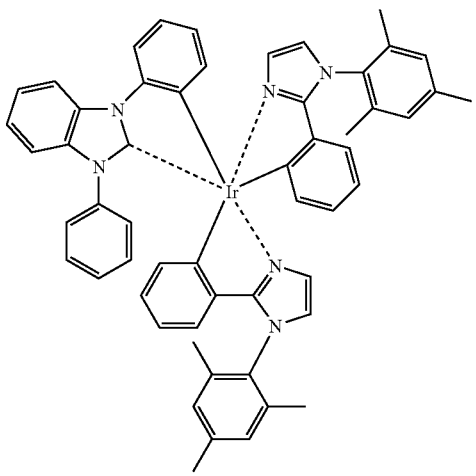

-continued
1-98
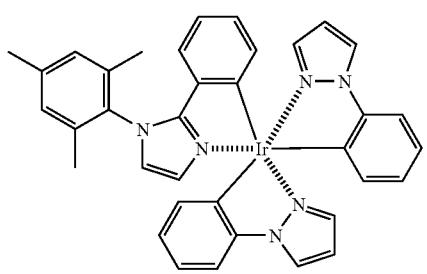
1-99
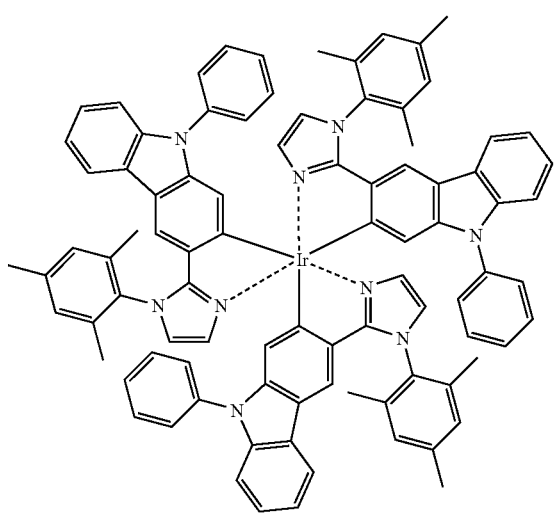
1-100
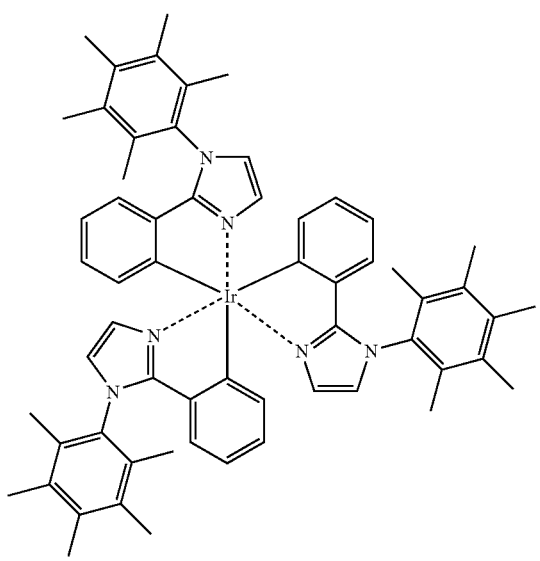
1-101
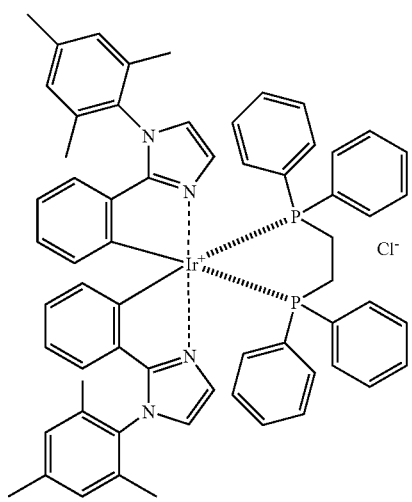
1-102
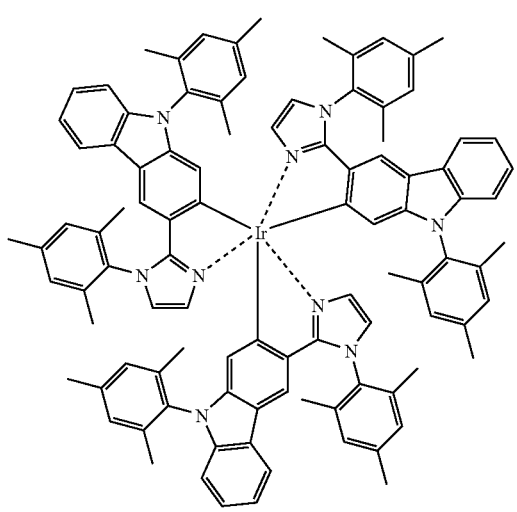
1-103
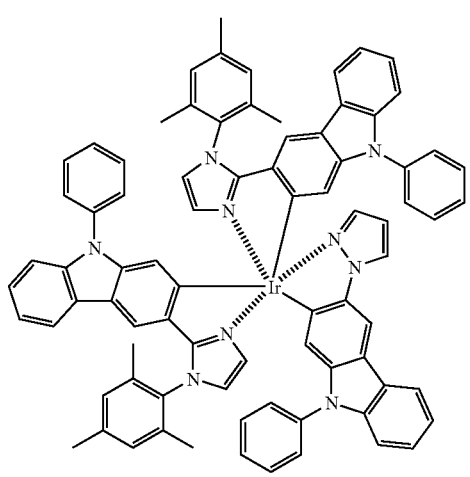

-continued 1-104

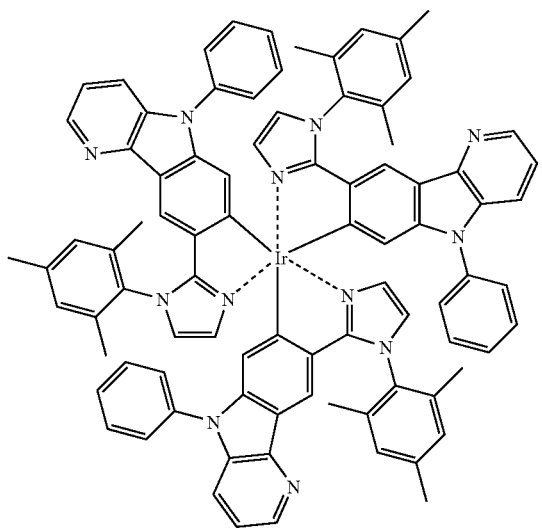

1-105

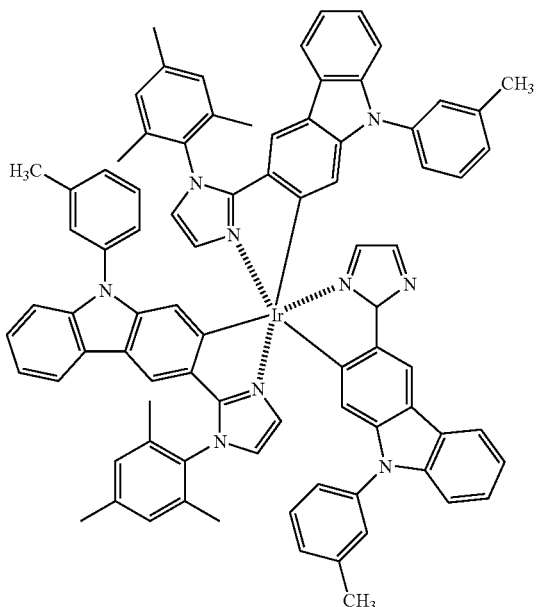

1-106

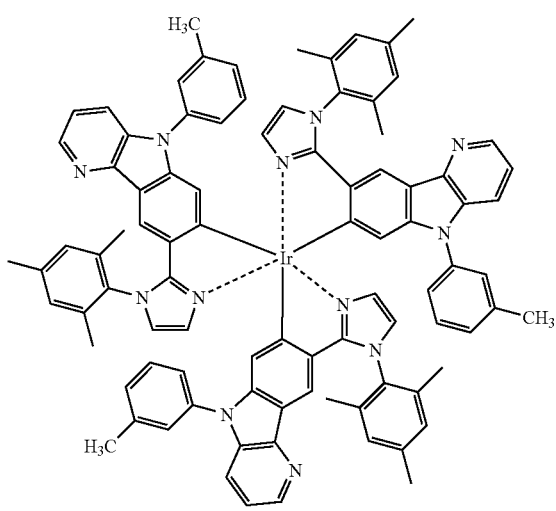

1-107

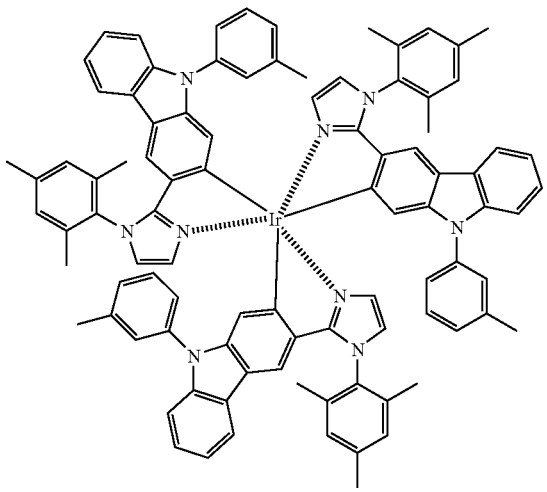

It is possible to synthesize these metal complexes, employing the methods described, for example, in Organic Letter, Vol. 3, No. 16, pages 2,579-2,581, Inorganic Chemistry, Volume 30, No. 8, pages 1,685-1,687 (1991), J. Am. Chem. Soc., Volume 123, pages 4,304 (2001), Inorganic Chemistry, Volume 40, No. 7, pages 1,704-1,711 (2001), Inorganic Chemistry, Volume 41, No. 12, pages 3,055-3,066 (2002), New Journal of Chemistry, Volume 26, page 1,171 (2002), and European Journal of Organic Chemistry, Volume 4, pages 695-709 (2004), as well as the methods described in the references cited in the above literatures.

(Host Compound)

As used herein, a "host compound" incorporated in the light emitting layer of the organic EL element according to the present invention refers to the compound which allows a light emitting compound to emit light in such a manner that energy of excitons formed via recombination of carriers on the above compound is transferred to light emitting compounds (light emitting dopants: guest compounds) and also allows a light emitting compound to emit light in such a manner that carriers on the above host compound are trapped by the above light emitting compound, followed by formation of excitons on the above light emitting compound.

In the present invention, the ratio of the host compound is preferably at least 20% by weight with respect to the compounds incorporated in the light emitting layer.

With regard to host compounds, conventional host compounds may be employed individually or in combinations of a plurality of types. By employing a plurality of types of host compounds, it is possible to regulate movement of electric charges, whereby it is possible to enhance the efficiency of organic EL elements. Further, by employing a plurality of types of phosphor emitting compounds which are employed as the light emitting dopant described below, it becomes possible to mix different colors of emitted light, whereby it is possible to obtain any of the colors of emitted light. It is possible to select the type of phosphorescence emitting compounds and regulate the amount of the dope, whereby application to lighting and backlights becomes possible.

Structures of the light emitting host compounds employed in the present invention are not particularly limited. Representative examples include carbazole derivatives, triarylamine derivatives, aromatic borane derivatives, nitrogen-containing heterocyclic compounds, thiophene derivatives, furan derivatives, compounds having a basic skeleton of oligoarylene compounds, carboline derivatives, diazacarbazole derivatives (those in which at least one of the carbon atoms of the hydrocarbon ring which constitutes a carboline ring of carboline derivatives is replaced with a nitrogen atom). Further, the host compound employed in the present invention may be a low molecular weight compound or a polymer compound having repeated units, as well as a low molecular weight compound (a vapor deposition polymerizable light emitting host) having a polymerizable group such as a vinyl group or an epoxy group.

The compounds represented by following Formula (a) are preferred as the host compound employed in the light emitting layer according to the present invention.

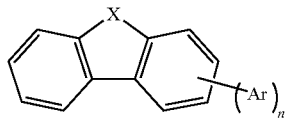

Formula (a)

In above Formula (a), X represents NR', O, S, CR'R", or SiR'R", wherein R' and R" each represents a hydrogen atom or a substituent; Ar represents an aromatic ring; and n represents an integer of 0-8.

In X of Formula (a), substituents represented by each of R' and R" include an alkyl group (for example, a methyl group, an ethyl group, a propyl group, an isopropyl group, a tert-butyl group, a pentyl group, a hexyl group, an octyl group, a decyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also called as an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantholyl group, an indenyl group, a pyrenyl group, and a biphenyryl group), an aromatic heterocyclic ring group (for example, a pyridyl group, a pyrimidinyl group, a furyl group, a pyrrolyl group, an imidazolyl group, a benzimidazolyl group, a pyrazolyl group, a pyrazinyl group, a triazolyl group (for example, a 1,2,4-triazole-1-yl group, a 1,2,3-triazole-1-yl group), an oxazolyl group, a benzoxazolyl group, a thiazolyl group, an isooxazolyl group, an anisothiazolyl group, a frazanyl group, a thienyl group, a quinolyl group, a benzofuryl group, a dibenzofuryl group, a benzothienyl group, a dibenzothienyl group, an indolyl group, a carbazolyl group, a carbonyl group, a diazacarbazolyl group (being a group in which one of the carbon atoms which constitute the carboline ring of the above carbolynyl group is replaced with a nitrogen atom), a quinoxalynyl group, a pyridadinyl group, a triazinyl group, a quinazolynyl group, and a phthaladinyl group), a heterocyclyl group (for example, a pyrrolidyl group, an imidazolydyl group, a morpholyl group, and an oxazolydyl group), an alkoxy group (for example, a methoxy group, an ethoxy group, a propyloxy group, a pentyloxy group, a hexyloxy group, an octyloxy group, and a dececyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), an ureido group (for example, a methylureido group, an ethylureido group, a pentylureido group, a cyclohexylureido group, an octylureido group, a dodecylureido group, a phenylureido group, a naphthylureido group, and a 2-pyridylureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butyl sulfonyl group, a cyclohexylsulfonyl group, a 2-ethylhexylsulfonyl group, and a dodecylsulfonyl group), an arylsulfonyl group or heteroarylsulfonyl group (for example, a phenylsulfonyl group, a naphthylsulfonyl group, a 2-pyridylsulfonyl group, an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group, and a pentafluorophenyl group), a cyano group, a nitro group, a hydroxyl group, a mercapto group, a silyl group (for example, a trimethylsilyl group, a triisopropylsilyl group, a triphenylsilyl group, and a phenyldiethylsilyl group), and a phosphono group.

These substituents may further be substituted with any of the above substituents, and a plurality of these substituents may bond to each other to form a ring.

In Formula (a), preferred X is either NR' or O, and an aromatic hydrocarbon group, and an aromatic heterocyclyl group is particularly preferred as R'.

In Formula (a), the aromatic ring represented by Ar includes an aromatic hydrocarbon ring and an aromatic heterocyclic ring. Further, the above aromatic ring may be either a single ring or a condensed ring, and may have no substituent or the substituent described below.

In Formula (a), listed as the aromatic hydrocarbon ring represented by Ar are a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoroanthene ring, a naphthacene ring, a pentacene ring, a perylene ring, a pentaphene ring, a picene ring, a pyrene ring, a pyranthrene ring, and an anthraanthorene ring.

In Formula (a), listed as the aromatic heterocyclic ring represented by Ar are, for example, a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, and a diazacarbazole ring (in which one of the carbon atoms of the hydrocarbon ring constituting a carboline ring is further replaced with a nitrogen atom). These rings may further have substituents.

Of the above rings, those, which are preferably employed, as the aromatic ring represented by Ar, are the carbazole ring, the carboline ring, the dibenzofuran ring, and the benzene ring. Of these, those, which are more preferably employed, are the carbazole ring, the carboline ring, and though benzene ring. Of the above, preferred is the benzene ring having a substituent and particularly preferred is the benzene ring having a carbazolyl group.

Further, in Formula (a), each of the condensed rings of at least three rings, as shown below, is one of the preferred embodiments. Specific examples of aromatic hydrocarbon condensed rings which are formed via condensation of at least three rings include a naphthacene ring, an anthracene ring, a tetracene ring, a pentacene ring, a hexacene ring, a phenanthrene ring, a pyrene ring, a benzopyrene ring, a benzazulene ring, a chrysene ring, a benzochrysene ring, an acenaphthene ring, an acenaphthylene ring, a triphenylene ring, a coronene ring, a benzocoronene ring, a hexabenzocoronene ring, a fluorene ring, a benzofluorene ring, a fluoranthene ring, a perylene ring, a naphthoperylene ring, a pentabenzopyrene ring, a benzopyrene ring, a pentaphene ring, a picene ring, a pyranthorene ring, a coronene ring, a naphthocoronene ring, an ovalene ring, and an anthraanthorene ring. These rings may further have a substituent.

Further, specifically listed as aromatic heterocyclic rings formed via condensation of at least three rings are an acridine ring, a benzoquinoline ring, a carbazole ring, a carboline ring, a phenazine ring, a phenanthridine ring, a phenanthroline ring, a carboline ring, a cyclazine ring, a quindoline ring, a thepenidine ring, a quindoline ring, a triphenodithiazine ring, a triphenedioxazine ring, a phenantrazine ring, an anthrazine ring, a perymidine ring, a diazacarbazole ring (referring to the compound in which any one of carbon atoms constituting a carboline ring is replaced with a nitrogen atom), a phenanthroline ring, a benzofuran ring, a dibenzothiophene ring, a naphthofuran ring, a naphthothiophene ring, a benzofuran ring, a benzothiophene ring, a naphthodifuran ring, a naphthodithiophene ring, an anthrafuran ring, an anthradifuran ring, an anthrathiophene ring, an anthradithiophene ring, a thianthorene ring, a phenoxathiin ring, a thiophanthorene ring (being a naphthothiophene ring). These rings may have a substituent.

In Formula (a), substituents which may be incorporated in the aromatic ring represented by Ar are R' and R" which are as defined as above.

Further, in Formula (a), n represents an integer of 0-8, but is preferably 0-2. Particularly, when X is O or S, n is preferably 1 or 2.

Specific examples of the light emitting host compounds represented by Formula (a) will now be shown; however, the present invention is not limited thereto.

2-1

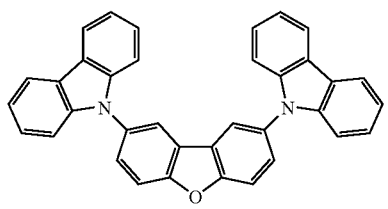

2-2

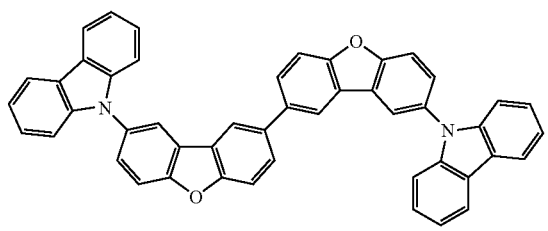

-continued
2-3
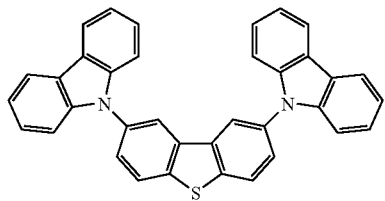
2-4
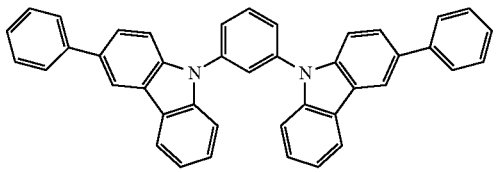
2-5
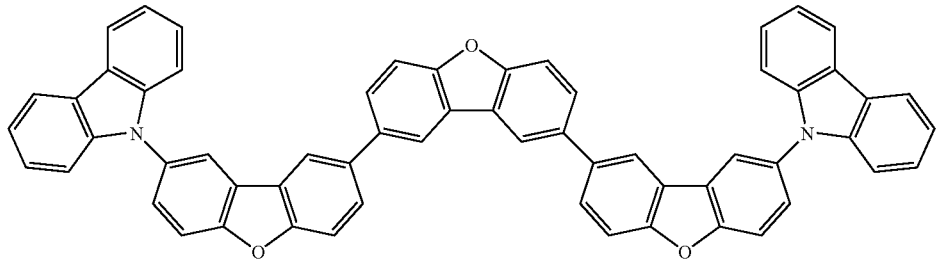
2-6
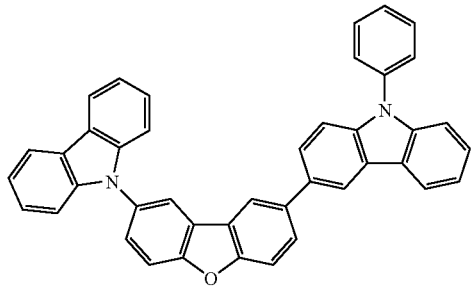
2-7
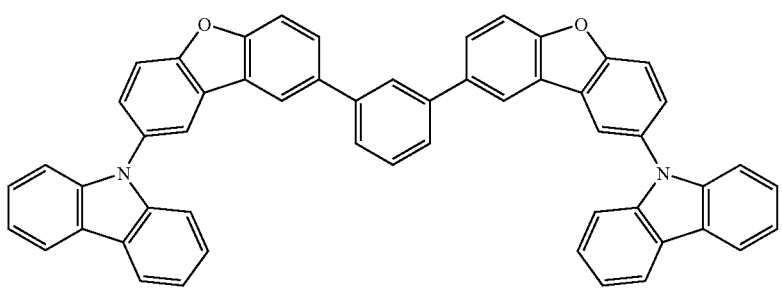
2-8
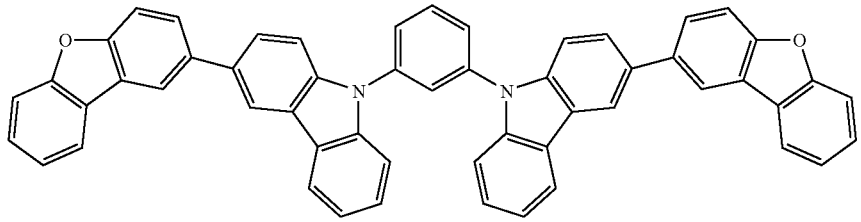
2-9
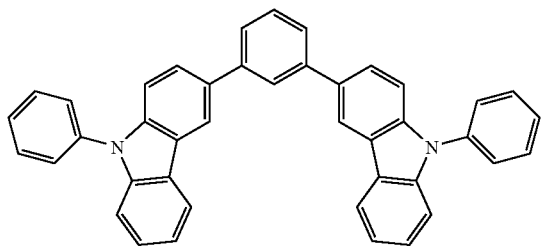
2-10
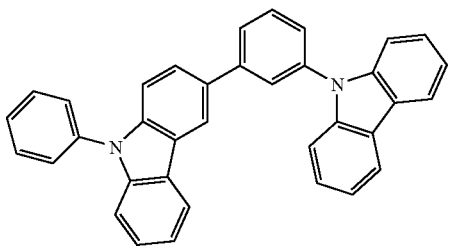

-continued
2-11
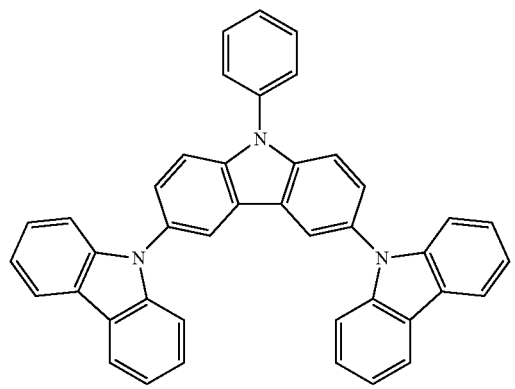
2-12
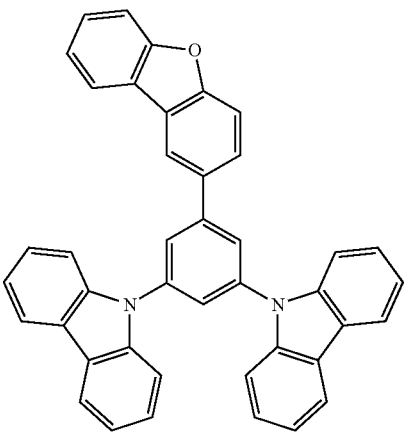
2-13
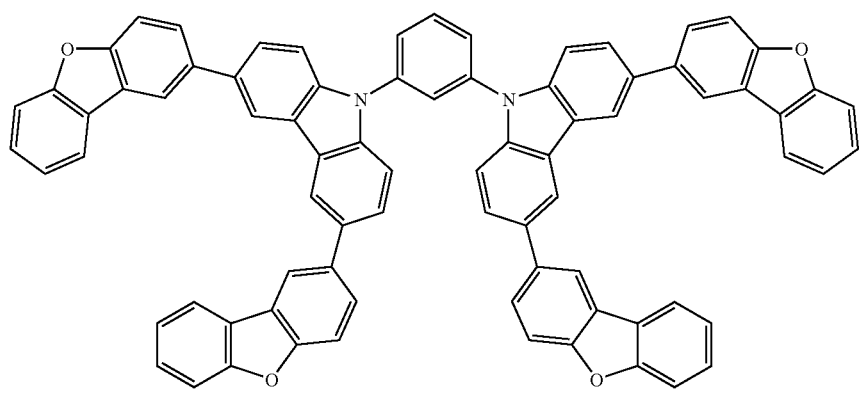
2-14
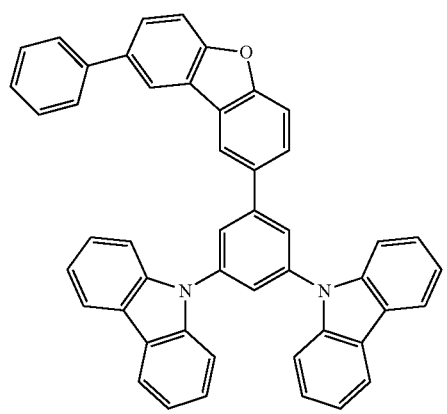
2-15
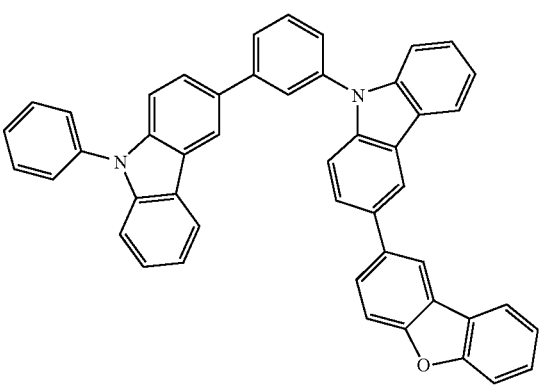
2-16
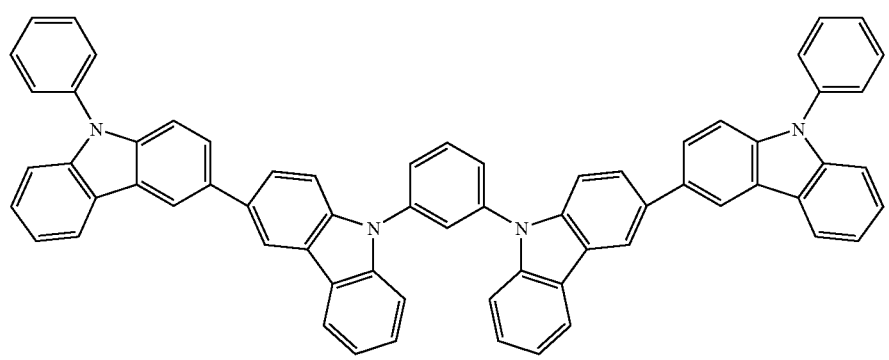

-continued
2-17
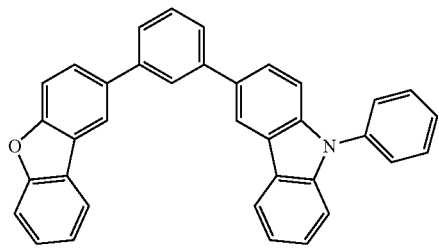
2-18
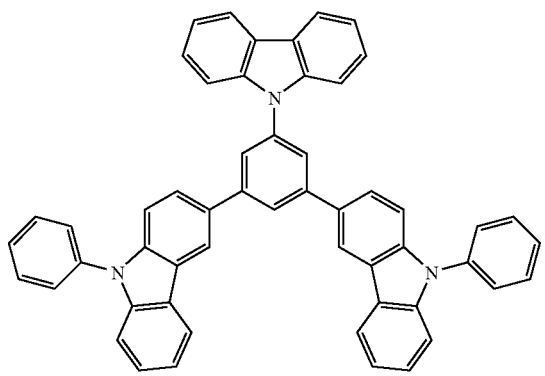
2-19
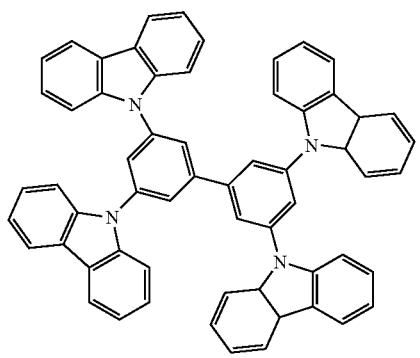
2-20
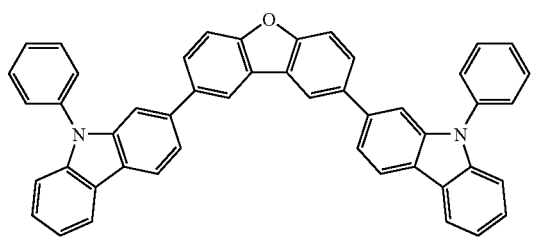
2-21
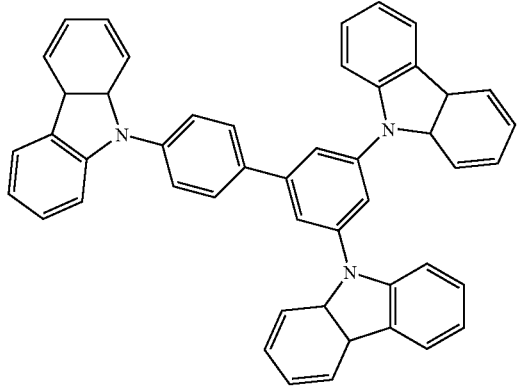
2-22
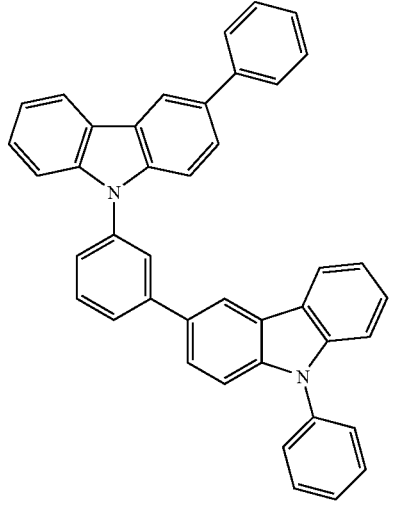
2-23
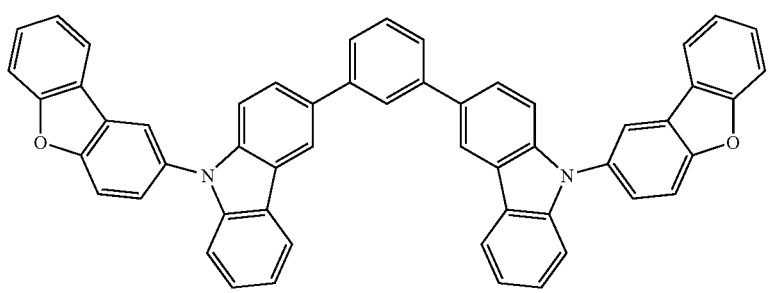

-continued
2-24
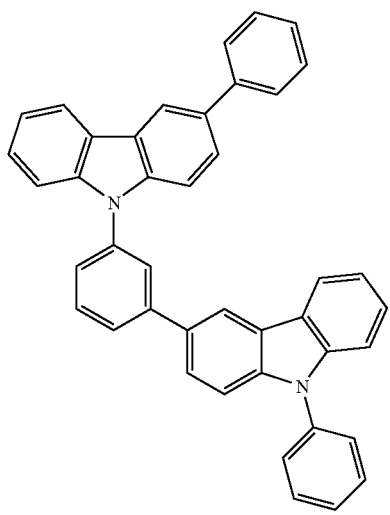
2-25
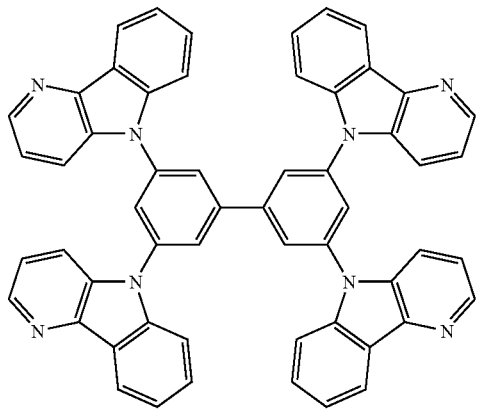
2-26
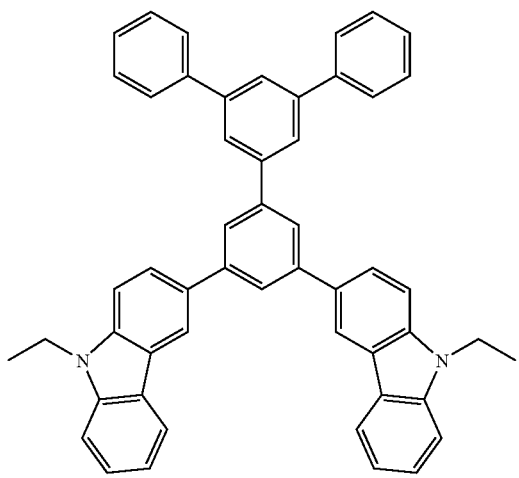
2-27
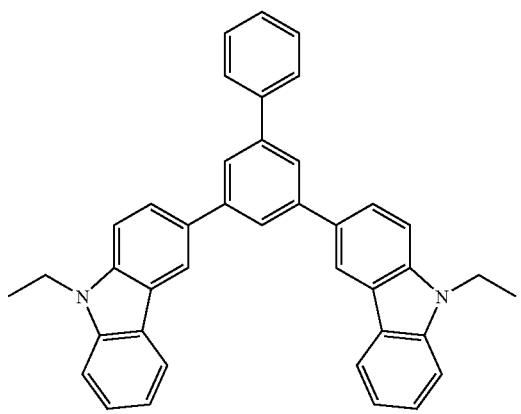
2-28
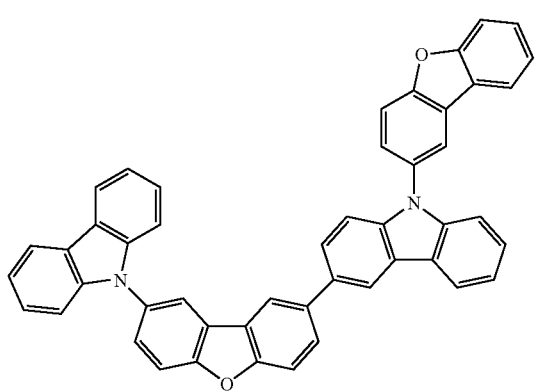
2-29
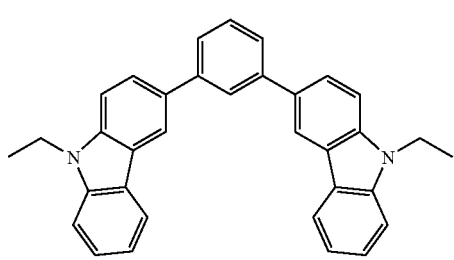

-continued
2-30
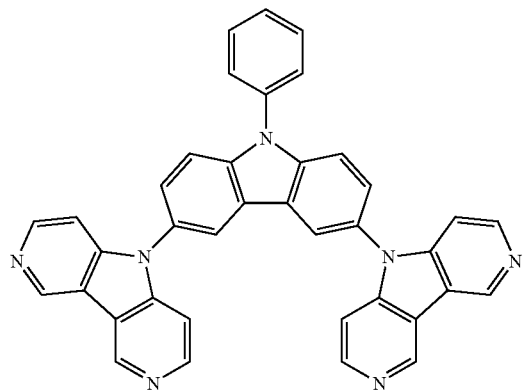
2-31
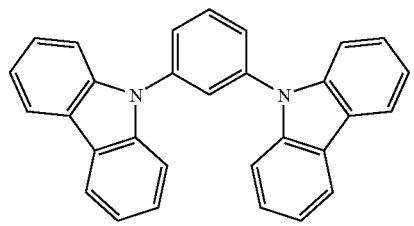
2-32
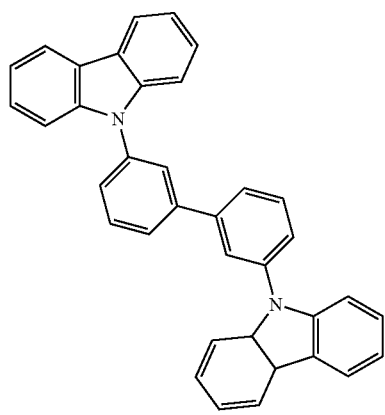
2-33
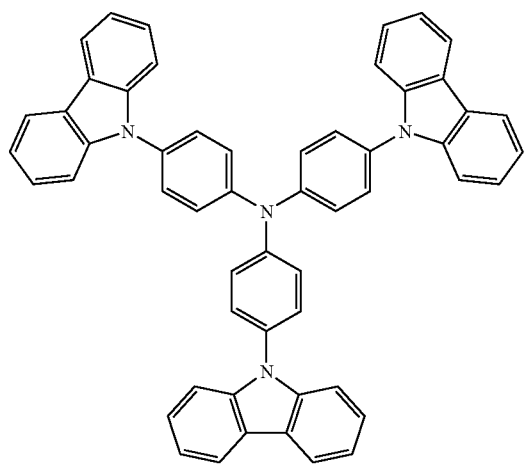
2-34
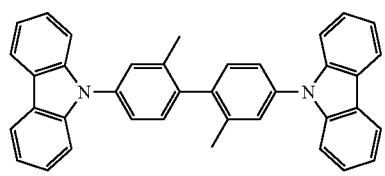
2-35
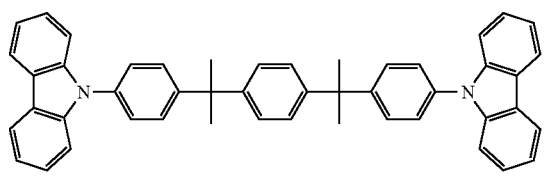
2-36
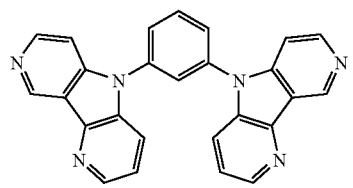
2-37
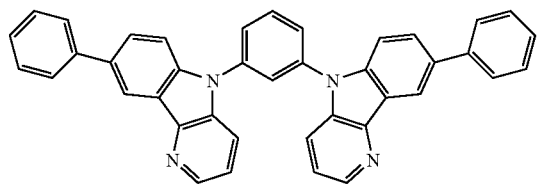

-continued
2-38
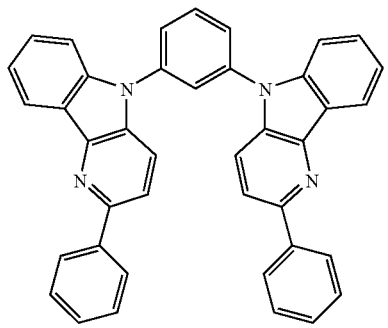
2-39
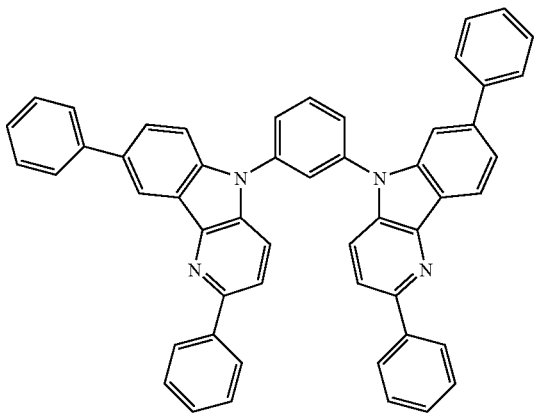
2-40
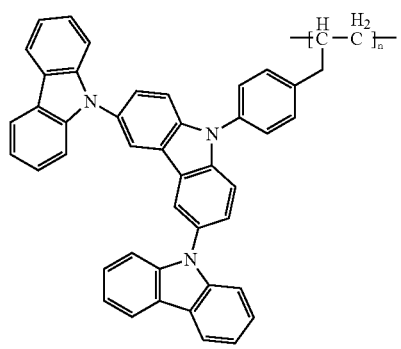
2-41
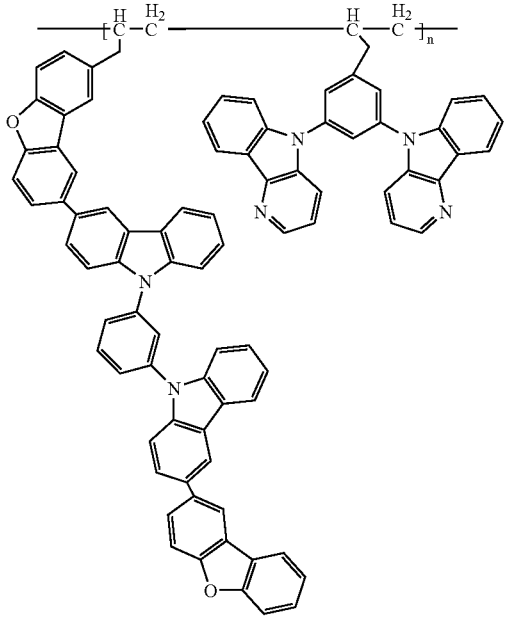
2-42
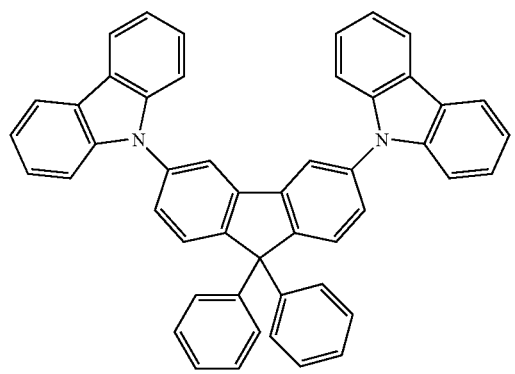
2-43
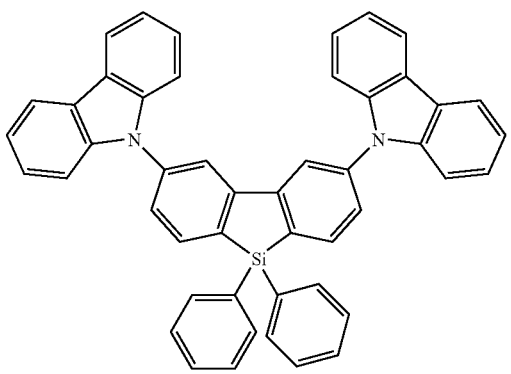
Further, specific examples of appropriate host compounds known in the art include the compounds described in the following documents; for example, JP-A Nos. 2001-257076, 2002-308855, 2001-313179, 2002-319491, 2001-357977, 2002-334786, 2002-8860, 2002-3347897, 2002-15871, 2002-334788, 2002-43056, 2002-334789, 2002-75645, 2002-338579, 2002-105445, 2002-343568, 2002-141173, 2002-352957, 2002-203683, 2002363227, 2002-231453, 2003-3165, 2002-234883, 2003-27048, 2002-255934, 2002-260861, 2002-280183, 2002-299060, 2002-302516, 2002-305083, 2002-305084, and 2002-308837.
Host compounds may be employed individually or in combinations of a plurality of types. In the present invention, it is preferable that at least two layers of the above first light emitting layer, the above second light emitting layer, and the above third light emitting layer incorporate the same host compound, and it is more preferable that all three layers incorporate the same host compound. When the light emitting layer is composed of at least three layers, it is more preferable that all light emitting layers incorporate the same host compound. It is preferable that each of the above first light emitting layer, the above second light emitting layer, and the above third light emitting layer incorporates the same host compound in an amount of 30% by weight with respect to each of the layers. The above same host compound, as described in the present invention, means that the employed compounds exhibit the same physicochemical characteristics such as a glass transition point or the same molecular structure.

Compounds preferred as host compounds include those which exhibit positive hole transportability and electron transportability, minimize an increase in the wavelength of emitted light and exhibit high Tg (glass transition temperature). In the present invention, the above glass transition temperature of the host compounds is preferably at least 90° C., but is more preferably at least 130° C. in view of realizing longer driving lifetime and excellent durability.

Glass transition point (Tg), as described herein, is the value which is determined based on the method specified in JIS K 7121, employing DSC (Differential Scanning Calorimeter).

Further, in view of being realizable of a higher light emission efficiency, it is preferable that the lowest excited triplet energy ($T_l$) of the host compounds incorporated in the above first light emitting layer, the above second light emitting layer, and the above third light emitting layer is at least 2.7 eV. Lowest excited triplet energy, as described in the present invention, refers to the peak energy of the light emission band corresponding to the transition between the lowest vibrational bands of the phosphorescence emission spectra which is observed at liquid nitrogen by dissolving a host compound in solvents.

In the organic EL element of the present invention, since host materials achieve transportation of carriers, materials are preferred which are capable of transporting carriers. Carrier mobility is employed as a physical characteristic to represent the transportability of carriers. It is commonly noted that the carrier mobility of organic materials depends on electric field strength. Since materials which highly depend on the electric field strength tend to destroy the balance of the infection and transportation of positive holes and electrons, it is preferable to employ, as the host materials, those of which mobility exhibits minimal dependence on the electric field strength.

<<Interlayer>>

In the organic EL element of the present invention, a non-light emitting interlayer (hereinafter also referred to as a non-dope region) may be provided between the light emitting layers.

The thickness of the non-light emitting interlayer is preferably in the range of 1-50 nm, but is more preferably in the range of 3-10 nm to retard the mutual interaction, such as an energy transfer, between the adjacent light emitting layers and to result in no high load to electric current and voltage characteristics of organic EL elements.

Materials employed in the above non-light emitting interlayer may be the same as the host compounds of the light emitting layer or differ. However, it is preferable that they are the same as the host materials of at least one of two adjacent light emitting layers.

The non-light emitting interlayer may incorporate compounds which are common to those (for example, host compounds) of each of the non-light emitting layers. By incorporating each of the common compounds (as used herein, "employing common host materials" refers to the case in which physicochemical characteristics such as phosphorescence emitting energy or the glass transition point are the same, or the case in which the molecular structure of the host compound is the same), the injection barrier between the light emitting layer and the non-light emitting layer is lowered, whereby it is possible to realize targeted effects in which even though the electric voltage and current change, it is easy to maintain a balance of positive hole and electron injection. Further, by employing, in the non-dope light emitting layer, host compounds which exhibit the same physical characteristics or have the same molecular structure as those of the host compounds incorporated in each of the light emitting layers, it is also possible to overcome major drawbacks during preparation of conventional organic EL elements such as troublesome element preparation.

Still further, in order to optimally regulate the positive hole and electron injection balance, also listed is a preferred embodiment in which the non-light emitting interlayer functions as the blocking layer described below, namely as a positive hole blocking layer and an electron blocking layer.

<<Injection Layers: Electron Injecting Layer and Positive Hole Injecting Layer>>

As needed, it is possible to provide the injection layer, which may be provided between the anode and the light emitting layer or positive hole transporting layer, and between the cathode and the light emitting layer or electron transporting layer.

The injecting layer, as described herein, refers to the layer which is provided between the electrode and the organic layer to lower the driving voltage and enhance emitted light luminance, and is detailed, for example, in Chapter 2 "Denkyoku Zairyo (Electrode Materials)" (pages 123-166), Second Part "Yuki EL Soshi to Sono Kogyoka Saizensen (Organic EL Elements and Forefront of Their Industrialization)" (published by NTS Inc., 30 Nov., 1998). The injecting layers include a positive hole injecting layer (being an anode buffer layer) and an electron injecting layer (being a cathode buffer layer).

The anode buffer layer (being the positive hole injecting layer) is detailed in JP-A Nos. 9-45479, 9-260062, and 8-288069. Specific examples thereof include a phthalocyanine buffer layer incorporating copper phthalocyanine as a representative compound, an oxide buffer layer incorporating vanadium oxide as a representative compound, an amorphous carbon buffer layer, and a polymer buffer layer employing electrically conductive polymers such as polyaniline (emeraldine) or polythiophene. Further, it is preferable to employ the materials described in Japanese Patent Publication Open to Public Inspection (under PCT Application) No. 2003-5619432.

The cathode buffer layer (being the electron injecting layer) is detailed in JP-A Nos; 6-325871, 9-17574, and 10-74586. Specifically listed are a metal buffer layer incorporating metals represented by strontium and aluminum, an alkaline metal compound buffer layer incorporating alkaline metal compounds represented by lithium fluoride, an alkaline earth metal compound buffer layer incorporating alkaline earth metal compounds represented by magnesium fluoride, and an oxide buffer layer incorporating oxides represented by aluminum oxide.

The above buffer layers (being injecting layers) are preferably thin films, and the film thickness is preferably in the range of 0.1 nm-5 μm though it may vary depending on the used components.

<<Blocking Layers: Positive Hole Blocking Layer and Electron Blocking Layer>>

Other than the basic constituting layer composed of thin organic compound layers, blocking layers are provided as needed. Examples thereof include positive hole blocking layers described, for example, in JP-A Nos 11-204258 and 11-204359, as well as on page 237 of "Yuki EL Soshi to Sono Kogyoka Saizensen (Organic EL Elements and Forefront of Their Industrialization)" (published by NTS Inc., 30 Nov., 1998).

The positive hole blocking layer, as described herein, is composed of positive hole blocking materials which exhibit, in a broad sense, the function of an electron transporting layer and also exhibit minimal positive hole transportability while exhibiting the function of electron transportation, and consequently, makes it possible to enhance recombination probability of electrons and positive holes by transporting electrons and simultaneously blocking positive holes. Further, it is possible to employ, as needed, the electron transporting layer configuration, described below, as the positive hole blocking layer.

It is preferable that the positive hole blocking layer provided in the organic EL element of the present invention is arranged to be adjacent to the light emitting layer.

On the other hand, the electron blocking layer, as described herein, is composed of materials which exhibit, in a broad sense, the function of the positive hole transporting layer and exhibit minimal electron transportability while exhibiting the function of transporting positive holes, and enables enhancement of recombination probability of electrons and positive holes while transporting electrons and simultaneously blocking electrons. Further, it is possible to, as needed, employ the constitution of the positive hole transporting layer, described below, as the electron blocking layer.

The thickness of the positive hole blocking layer and the electron transporting layer according to the present invention is preferably 3-100 nm, but is more preferably 5-30 nm.

<<Positive Hole Transporting Layer>>

The positive hole transporting layer, as described herein, is composed of positive hole transporting materials which exhibit the function of transporting positive holes, and in a broad sense, includes a positive hole injecting layer and an electron blocking layer. The positive hole transporting layer may be composed of a single layer or a plurality of layers.

Positive hole transporting materials are those which exhibit either the injection or transportation of positive holes, or the blocking of electrons, and may be either organic or inorganic compounds. Examples thereof include triazole derivatives, oxazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, and aniline based copolymers, as well as electrically conductive macromolecular oligomers, especially thiophene oligomers.

It is possible to employ, as positive hole transporting materials, the above materials. In addition, it is preferable to employ porphyrin compounds, aromatic tertiary amine compounds, and styrylamine compounds. Of these, it is particularly preferred to employ the aromatic tertiary amine compounds.

Representative examples of the aromatic tertiary amine compounds and styrylamine compounds include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4-diaminodiphenyl ether, 4,4'-bis(diphenylamino) quaterphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene, and N-phenylcarbazole. Further listed are compounds having two condensed aromatic rings in the molecule such as 4,4'-bis[N-(1-naphthyl)-N-phenylamino]biphenyl (NPD), described in U.S. Pat. No. 5,061,569 and 4,4',4"-tris[N-(3-methylphenyl)-N-phenylamino]triphenylamine (MTDATA) in which three triphenylamine units are linked in a starburst type, described in JP-A No. 4-308688.

In addition, it is possible to employ polymer materials which are formed by introducing the above materials into polymer chains or in which the above materials are employed as a main chain. Further, it is possible to employ inorganic compounds such as p type-Si or p type SiC as a positive hole injection material and a positive hole transporting material.

It is further possible to employ positive hole transporting materials, which exhibit so-called p type semiconductor properties, described in JP-A Nos. 4-297076, 2000-196140, and 2001-102175; J. Appl. Phys., 95, 5773 (2004); JP-A No. 11-251067; J. Huang et al. literature (Applied Physics Letters 80 (2002); and Japanese Patent Publication Open to Public Inspection (under PCT Application) No. 2003-519432. In the present invention, it is preferable to employ these materials since light emitting elements of a higher efficiency are prepared.

It is possible to form a positive hole transporting layer in such a manner that the above positive hole transporting materials are subjected to thin film formation employing the methods, known in the art, such as a vacuum deposition method, a spin coating method, a casting method, a printing method including an ink-jet method, or an LB method. The thickness of the positive hole transporting layer is not particularly limited. The above thickness is commonly 5 nm-5 μm, but is preferably 5-200 nm. The above positive hole transporting layer may be in a single layer structure composed of at least one type of the above materials.

<<Electron Transporting Layer>>

The electron transporting layer, as described herein, is composed of materials which exhibit a function to transport electrons, and includes, in a broad sense, an electron ejecting layer and a positive hole blocking layer. The electron transporting layer may be composed of a single layer or a plurality of layers.

Heretofore, in the case of a single electron transporting layer or a plurality of them, electron transport materials (which also work as positive hole blocking materials), which are employed in the electron transporting layer adjacent to the cathode electrode side with respect to the light emitting layer, have been applicable when they exhibit a function to transfer electrons injected from the cathode to the light emitting layer. As such materials, it is possible to employ any of those selected from the compounds known in the art. Examples thereof include nitro-substituted fluorene derivatives, diphenylquinone derivatives, thiopyran dioxide derivatives, carbodiimide, fluorenylydenemethane derivatives, anthraquinodimethane and anthrone derivatives, as well as oxadiazole derivatives. Further employed as electron transporting materials may be thiadiazole derivatives, which are prepared by replacing the oxygen atom of the oxadiazole ring in the above oxadiazole derivatives with a sulfur atom, as well as quinoxaline derivatives known as an electron attractive group. Further, it is possible to employ polymer materials which are prepared by introducing any of the above materials into the polymer chain or in which any of the above materials are employed as the main chain of the polymer.

Further employed as the electron transporting materials may be metal complexes of 8-quinolinol derivatives such as tris(8-quinolinol)aluminum (ALq), tris(5,7-dichloro-8-quinolinol)aluminum, tris(5,7-dibromo-8-quinilinol)aluminum, tris(2-methyl-8-quinolinol)aluminum, tris(5-methyl-8-quinilinol)aluminum, or bis(8-quinolinol)zinc, or metal complexes in which the central metal atom of these metal complexes is replaced with In, Mg, Cu, Ca, Sn, Ga, or Pb. Other than these, preferably employed as the electron transporting materials may be metal free or metal phthalocyanines, or compounds in which the end of the above phthalocyanine is substituted with an alkyl group or a sulfonic acid group. Further employed as electron transporting materials may be distyrylpyrazine derivatives. Still further employed as electron transporting materials may be inorganic semiconductors such as n type-Si or n type-SiC in the same manner as in the positive hole injecting layer and positive hole transporting layer.

It is possible to form the electron transporting layer in such a manner that the above electron transporting materials are modified to be a thin film via methods known in the art such as a vacuum deposition method, a spin coating method, a casting method, a printing method including an ink-jet method, or an LB method. The thickness of the electron transporting layer is not particularly limited, and is commonly about 5 nm-about 5 µm, but is preferably 5-200 nm. The electron transporting layer may be in a single layer structure composed of at least one of the above materials.

Further, it is possible to employ electron transporting materials which are thought to exhibit properties of n type semiconductors doped with impurities Examples thereof include those described in JP-A Nos. 4-297076, 10-270172, 2000-196140, and 2001-102175, as well as J. Appl. Phys., 95, 5773 (2004).

In the present invention, it is preferable to employ such electron transporting materials which are thought to exhibit properties of n type semiconductors, since it is thereby possible to prepare an element which consumes less power.

<<Substrates>>

Types of substrates (hereinafter also referred to as bases, base boards, base materials, or supports) are not particularly limited to glass and plastic, and may further be transparent or opaque. When light passing through a substrate is utilized, the substrate is preferably transparent. It is possible to list, as preferably employed transparent substrates, glass, quartz, or a transparent resin film. Of these, the particularly preferred substrate is a resin film capable of resulting in flexibility of the organic EL elements.

Examples of materials of such a resin film include polyester such as polyethylene terephthalate (PET), or polyethylene naphthalate (PEN); cellulose esters or derivatives thereof such as polyethylene, polypropylene, cellophane, cellulose diacetate, cellulose triacetate, cellulose acetate butyrate, cellulose acetate propionate (CAP), cellulose acetate phthalate (TAC), or cellulose nitrate; polyvinylidene chloride, polyvinyl alcohol, polyethylene vinyl alcohol, syndiotactic polystyrene, polycarbonate, norbornene resins, polymethylpentane, polyether ketone, polyimide, polyether sulfone (PES) polyphenylene sulfide, polysulfones, polyetherimide, polyetherketoneimide, polyamide, fluororesins, nylon, polymethyl methacrylate, acryl or polyacrylates, and cycloolefin based resins such as ARTON (a registered trade, produced by JSR Co.) or APERU (a registered trade name, produced by Mitsui Chemical Co., Ltd.). Formed on the surface of the resin film, may be a film of inorganic or organic compounds or a hybrid film of both of them. The above film is preferably a barrier exhibiting film of a water vapor permeability of at most $1 \times 10^{-3}$ g/(m$^2$·24 hours) (at 25±0.5° C. and relative humidity 90±2%), which is determined based on the method of JIS K 7129 1992. Further, the above film is preferably a high barrier exhibiting film of an oxygen permeability of at most $1 \times 10^{-3}$ ml/m$^2$·24 hours determined based on the method of JIS K 7126 1987 and a water vapor permeability of $1 \times 10^{-3}$ g/(m$^2$·24 hours) (25±0.5° C. and relative humidity 90±2%).

As a material to form the barrier film, employed may be those which exhibit a function to retard the penetration of materials such as moisture or oxygen which degrade elements, and it is possible to employ, for example, silicon oxide, silicon dioxide, or silicon nitride. Further, in order to decrease brittleness, it is preferable to form a laminated layer structure composed of an inorganic layer and a layer incorporating organic materials. The lamination order of the inorganic and organic layers is not particularly limited. It is preferable that both are alternately laminated several times.

Preparation methods of the barrier film are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method. Of these, particularly preferred is the atmospheric pressure plasma polymerization method, as described in JP-A No. 2004-68143.

Examples of opaque substrates include metal plates or films composed of aluminum or stainless steel, opaque resin substrates, and substrates composed of ceramic materials.

<<Sealing>>

It is possible to list, as a sealing means employed to seal the organic EL element of the present invention, for example, a method which allows a sealing member to adhere to the electrodes and a substrate employing adhesives.

The sealing member may be arranged to cover the display region of the organic EL element, and may be either in the form of an intaglio plate or a flat plate. Further, transparency and electric insulation are not particularly limited.

Specifically listed are glass plates, polymer plate/film, and metal plate/film. Glass plates may include specifically soda-lime glass, barium and strontium containing glass, lead glass, aluminosilicic acid glass, borosilicic acid glass, barium borosilicic acid glass, and quartz. Further, listed as the polymer plates may be those composed of polycarbonate, acryl, polyethylene terephthalate, polyether sulfide, and polysulfone, while listed as the metal plates may be those composed of at least one metal selected from the group consisting of stainless steel, iron, copper, aluminum, magnesium, nickel, zinc, chromium, titanium, molybdenum, silicon, germanium and tantalum, or an alloy composed of at least two metals selected from the above group.

In the present invention, it is possible to preferably employ polymer and metal films since it is possible to modify an element to a thinner film. Furthermore, it is preferable that the polymer film exhibits a barring property film of a water vapor permeability of at most $1 \times 10^{-3}$ g/(m²·24 hours) (at 25±0.5° C. and relative humidity 90±2%) which is determined by the method based on JIS K 7129 1992. It is more preferable that the polymer film exhibits a higher barring property of an oxygen permeability of at most $1 \times 10^{-3}$ ml/m²·24 hours·atmosphere, which is determined by the method based on JIS K 7126 1987 and a water vapor permeability of $1 \times 10^{-3}$ g/(m²·24 hours).

In order to achieve hollow machining of a sealing member, employed may be sand blasting or chemical etching. It is possible to specifically list, as an adhesive, photocurable and thermocurable type adhesives having a reactive vinyl group of acrylic acid based oligomers and methacrylic acid based oligomer, and moisture curable type adhesives such as 2-cyanoacrylic acid ester. Further, it is possible to list a thermal and chemical curing type (two blended liquids). Still further, it is possible to list hot-melt type polyamide, polyester, and polyolefin. Still further, it is possible to list cationically curable type ultraviolet ray curable type epoxy resin adhesives.

Since organic EL elements are occasionally degraded due to a thermal treatment, preferred are those which are adhesion-curable from room temperature to 80° C. Further, desiccants may be dispersed into the above adhesives. Application of adhesives onto the sealing portion may be achieved by a commercial dispenser or printed in the same manner as screen printing.

Further, inorganic and organic material layers are formed in such a configuration that in the outside of an electrode on the side which interposes an organic layer and faces a substrate, the aforesaid electrode and organic layer are covered in the form of contact with the substrate. The above inorganic and organic layer is preferably employed as the sealing film. In this case, any of the materials may be applied to the aforesaid film as long as they exhibit a function to retard penetration of materials, such as moisture or oxygen, which result in degradation of the element. Usable examples thereof include silicon oxide, silicon dioxide, and silicon nitride. Further, in order to improve flexibility of the aforesaid film, it is preferable that a laminated layer structure is realized employing these inorganic layers and layers composed of organic materials. Forming methods of these films are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure polymerization method, a plasma CVD method, a laser CVD method, a thermal CVD method, or a coating method.

It is preferable that in a gas and liquid phase, inert gases such as nitrogen or argon and chemically stable liquid such as fluorinated hydrocarbon or silicone oil are injected into the space between the sealing member and the display area of the organic EL element. Further, it is possible to form a vacuum. Still further, it is possible to enclose hygroscopic compounds within the interior.

Examples of hygroscopic compounds include metal oxides (for example, sodium oxide, potassium oxide, calcium oxide, barium oxide, magnesium oxide, or aluminum oxide), sulfates (for example, sodium sulfate, calcium sulfate, magnesium sulfate, or cobalt sulfate), metal halides (for example, calcium chloride, magnesium chloride, cesium fluoride, tantalum fluoride, cerium bromide, magnesium bromide, barium iodide, or magnesium iodide), and perchlorates (for example, barium perchlorate or magnesium perchlorate). Of sulfates, metal halides, and perchlorates, anhydrous salts are suitably employed.

<<Protective Film and Protective Plate>>

In order to enhance mechanical strength of the element, a protective film or a protective plate may be provided on the exterior side of the above sealing film on the side facing a substrate, while interposing an organic layer or the above sealing film. Specifically, when sealing is conducted via the above sealing film, the resulting strength is not always sufficient. Consequently, it is preferable to provide the above protective film or protective plate. It is possible to employ, as usable materials for the above, glass plates, polymer plate/film, and metal plate/film which are the same as those employed for the above sealing. In view of light weight and thin film formation, it is preferable to employ polymer films.

<<Anode>>

As an anode in the organic EL element, preferably employed are those which employ, as electrode materials, metals, alloys, electrically conductive compounds, and mixtures thereof, which exhibit a relatively high work function (at least 4 eV). Specific examples of such electrode materials include metals such as Au, and electrically conductive transparent materials such as CuI, indium tin oxide (ITO), $SnO_2$, or ZnO. Further employed may be IDIXO ($In_2O_3$—ZNO) which enables formation of an amorphous, transparent, and electrically conductive film. The anode may be formed in such a manner that a thin film is formed via methods such as vapor deposition or sputtering, employing these electrode materials, and the desired shaped pattern is formed via a photolithographic method. Further, when pattern accuracy is not strongly needed (at least about 100 μm), a pattern may be formed via the desired shaped mask during vapor deposition or sputtering of the above electrode materials. Alternately, when materials such as organic electrically conductive compounds, capable of being coated, are employed, it is possible to employ wet system film making methods such as a printing system or a coating system. When light is emitted from the above anode, it is desirable that transmittance is at least 10% and it is preferable that sheet resistance as the anode is at most a few hundred Ω/□. Further, the selected film thickness, depending on materials, is commonly in the range of 10-1,000 nm, but is preferably in the range of 10-200 nm.

<<Cathode>>

On the other hand, as a cathode preferably employed are those which employ, as electrode materials, metal (called electron injecting metals), alloys, electrically conductive compounds, and mixtures thereof, which exhibit a relatively low work function (at most 4 eV). Specific examples of such electrode materials include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and rare earth metals. Of these, in view of electron injection capability and resistance to oxidation, suitable are mixtures of an electron injecting metal and a second metal which is stable and exhibits a higher work function than that of the above metal, such as a magnesium/silver mixture, a magnesium/aluminum mixture, a magnesium/indium mixture, an aluminum/aluminum oxide ($Al_2O_3$) mixture, a lithium/aluminum mixture, or aluminum. It is possible to prepare the cathode via formation of a thin film of the above electrode materials, employing methods such as vapor deposition or sputtering. It is preferable that sheet resistance as the cathode is at most a few hundred Ω/□. Further, the film thickness is commonly selected to be in the range of 10 nm-5 μm, but is preferably selected to be in the range of 10-200 nm. In order to transmit the emitted light, it is advantageous that either the anode or the cathode is transparent or translucent to enhance luminance of the emitted light.

Further, it is possible to prepare a transparent or translucent cathode in such a manner that after preparing the above metal film, of a thickness of 1-20 nm, on the cathode, electrically conductive transparent materials, listed in the description of the anode, are applied onto the above film. By applying the above, it is possible to prepare an element in which both the anode and the cathode exhibit transparency.

<<Preparation Method of Organic EL Element>>

As one example of the preparation method of the organic EL element of the present invention, described is a preparation method of an organic EL element composed of an anode/ positive hole injecting layer/positive hole transporting layer/ light emitting layer/positive hole blocking layer/electron transporting layer/cathode.

Initially, an anode is prepared in such a manner that a thin film composed of desired electrode materials, such as anode materials, is formed to result in a film thickness of at most 1 μm, but preferably 10-200 nm, employing vapor deposition or sputtering. Subsequently, formed on the above is a thin film of organic compounds composed of a positive hole injecting layer, a positive hole transporting layer, a light emitting layer, a positive hole blocking layer, and an electron transporting layer.

Methods to decrease the thickness of the above organic compound thin film include, as described above, a vacuum deposition method and wet processes (such as a spin coating method, a casting method, an ink-jet method, or a printing method). In view of easier formation of a homogeneous film and inhibition of pin hole formation, particularly preferred are the vacuum deposition method, the spin coating method, the ink-jet printing method, and the printing method. Further, different film making methods may be applied to each of the layers. When the vapor deposition method is employed for making film, its vapor deposition conditions differ depending on the type of employed compounds. However, it is commonly preferable to select suitable conditions within the following range: a board heating temperature of 50-450° C., a degree of vacuum is $10^{-6}$-$10^{-2}$ Pa, a deposition rate of 0.01-50 nm/second, a substrate temperature of −50-300° C., a film thickness of 0.1 nm-5 μm, but preferably is 5-200 nm. After formation of these layers, a thin film composed of cathode materials is formed on the resulting layers to reach a film thickness of at most 1 μm but preferably in the range of 50-200 nm, employing a method such as vapor deposition or sputtering, whereby a cathode is provided. Thus, an intended organic EL element is prepared. In the above preparation of organic EL elements, it is preferable that during a single formation of vacuum, preparation from the positive hole injecting layer to the cathode is consistently conducted. However, the above process may be terminated and a differing film making method may be employed. In such a case, it must be realized that preparation is conducted in an ambience of dry inert gases.

Further, the above preparation order may be reversed, and preparation may be conducted in the order of the cathode, the electron injecting layer, the electron transporting layer, the light emitting layer, the positive hole transporting layer, the positive hole injecting layer, and the anode. When direct current voltage is applied to the multicolor display device prepared as above, a voltage of 2-40 V is applied while the anode is employed at positive polarity, and the anode is employed at negative polarity, whereby it is possible to observe light emission. Further, alternating current voltage may be applied, of which waveform of the applied alternating current is not limited.

It is commonly stated the in organic electroluminescent elements, light emission occurs in the layer at a refractive index (being about 1.6-about 2.1) higher than that of air, whereby about 15-20% of light emitted in the layer is available. The reasons are that light, incident to the interface (being the interface between the transparent substrate and air) at angle θ, which is greater than the critical angle, is totally reflected, whereby no light is emitted to the exterior, and light is totally reflected between the transparent electrode or the light emitting layer and the transparent substrate so that the light is lead to the transparent electrode or the light emitting layer, whereby light escapes in the element side direction.

Means which enhance the availability of light in the exterior include, for example, a method in which irregularity is formed on the surface of the transparent substrate so that total reflection at the interface between the transparent substrate and air is minimized (for example, U.S. Pat. No. 4,774,435); a method in which efficiency is enhanced by allowing the substrate to exhibit light focusing properties (for example, JP-A No. 63-314795); a method in which a reflective surface is formed on the side of the element (for example, JP-A No. 1-220394); a method in which a flat layer exhibiting an intermediate refractive index is introduced between the substrate and the light emitting body, whereby a reflection inhibiting film is formed (for example, JP-A No. 62-172691); a method in which a flat layer of a refractive index lower than that of the substrate is introduced between the above substrate and the light emitting body (for example, JP-A No. 2001-202827); and a method in which a diffraction grating is arranged between the substrate and any layer of the transparent electrode layer and the light emitting layer (including between the substrate and the exterior (JP-A No. 11-283751).

In the present invention, it is possible to employ the above methods in combination with the electroluminescent element of the present invention. However, it is also possible to employ an appropriate method in which a flat layer of a refractive index lower than that of the substrate is introduced between the above substrate and the light emitting body, or a method in which a diffraction grating is arranged between the substrate and any layer of the transparent electrode layer and the light emitting layer (including between the substrate and the exterior).

By combining these methods, the present invention enables preparation of an element which exhibits high luminance and excellent durability.

By forming, between the transparent electrode and the transparent substrate, a medium of a low refractive index at a thickness greater than the wavelength of light, light emitted from the transparent electrode results in higher emission efficiency to the exterior as the refractive index of the medium decreases.

Examples of the low refractive index layers include aerogel, porous silica, magnesium fluoride, and fluorine based polymers. Since the refractive index of the transparent substrate is commonly 1.5-1.7, the refractive index of the above low refractive index layer is preferably at most 1.5, but is more preferably at most 1.3.

Further, the thickness of the low refractive index medium is preferably at least twice the wavelength in the medium. The reason is that when the thickness of the low refractive index medium approaches light wavelength, whereby electromagnetic wave oozed via evernescent enters into the substrate, effects of the low refractive index layer are reduced.

A method to introduce the interface which results in total reflection or a diffraction grating into any of the media is characterized in resulting in highly enhanced effects of the efficiency of light emission to the exterior. In the above method, by utilizing properties of the diffraction grating in which it is possible to change the direction of light to a specified direction differing from diffraction via so-called Bragg diffraction, such as primary diffraction or secondary diffraction, of light generated from the light emitting layer, the light, which is not capable of emitting to the exterior, is subjected to diffraction via the introduction of the diffraction grating between any layers or in the medium (in the transparent substrate or the transparent electrode so that light is emitted to the exterior.

It is preferable that the introduced diffraction grating exhibits a two-dimensional cyclic refractive index. The light emitting layer randomly emits light in all directions. When a common one-dimensional diffraction grating, which exhibits a cyclic refractive index distribution only in a certain direction, is employed, light directed to a specified direction is only diffracted whereby the ratio of light emitted to the exterior is not so enhanced.

However, by changing the refractive index distribution to a two-dimensional one, light directed to all directions is diffracted to enhance the ratio of light emitted to the exterior.

The location of the diffraction grating may be between any layers or in a medium (in a transparent substrate or a transparent electrode), but a position is preferred which is near the organic light emitting layer where light is emitted. At such time, the cycle of the diffraction grating is preferably about ½-about 3 times the wavelength of the light in the medium. With regard to the arrangement of the diffraction grating, it is preferable that a two-dimensional arrangement such as a square lattice shape, a triangle lattice shape, or a honeycomb shape.

In the organic electroluminescent element of the present invention, it is possible to enhance luminance in a specified direction in such a manner that machining is conducted so that for example, a structure on a microlens array is provided on the side of the support plate (the substrate) from which light is emitted, or a so-called light focusing sheet is fitted together.

In an example of the above microlens array, quadrangulars are two-dimensionally arranged on the substrate side from which light is emitted so that one side length is 30 µm and the apex angle is 90 degrees. The side length is preferably 10-100 µm. When it is at most the above length, diffraction effects occur to result in coloration, while when it is excessively longer, the thickness increases, neither of which is preferred.

As the focusing sheet, it is possible to employ, for example, those which are commonly put into practice in LED backlights of liquid crystal display devices. As such a sheet employed may be the luminance enhancing film (BEF), produced by Sumitomo 3M Co., Ltd.

Further, to control the radiation angle of light from the organic EL element, simultaneously employed may be light diffusion plate/films and focusing sheets. For example, employed may be the light diffusion film (LIGHT-UP), produced by Kimoto Co., Ltd.

<<Display Device>>

The organic EL element of the present invention is employed in a multicolor or white display device. In the case of the multicolor or white display device, a shadow mask is provided only during formation of the light emitting layer, and it is possible to form film on one side, employing a vapor deposition method, a casting method, a spin coating method, an ink-jet method, or a printing method. When only the light emitting layer is subjected to patterning, its methods are not particularly limited, but the preferred methods include the vapor deposition method, the ink-jet method, and the printing method. When the vapor deposition method is employed, a patterning shadow mask is preferred.

Further, by reversing the preparation order, it is possible to carry out the preparation in the order of a cathode, an electron transporting layer, a positive hole blocking layer, a light emitting layer unit (which is composed of at least three layers of the above light emitting layers A, B, and C and may be composed of a non-light emitting interlayer between each of the light emitting layers), a positive hole transporting layer, and an anode. When direct current voltage is applied to the multicolor or white display device prepared as above, application of voltage of about 2-about 40 V, while the anode is at positive polarity and the cathode is at negative polarity, results in observable light emission. Further, when voltage is applied at reversed polarity, no electric current flows to result in no light emission. Still further, when alternating current voltage is applied, light emission results only when the anode is in the negative state, while the cathode is in the positive state. The waveform of applied alternating current is not particularly limited.

A lighting device, to which the organic EL element of the present invention is applied, will now be described.

The organic EL element of the present invention may be employed as a type of lamps for lighting or an exposure light source. Further, it may be employed as a display for the type in which still images as well as moving images are directly visible. A driving system, when employed as a display device for reproducing moving images, may be either a simple matrix (a passive matrix) system or an active matrix system.

The white organic electroluminescent element employed in the present invention, if desired, may be subjected to patterning during film making, employing a metal mask or an ink-jet printing method. The electrode and the light emitting layer may be subjected patterning, or all element layers may be subjected to patterning. Light emitting dopants employed in the light emitting layer are not particularly limited. For example, in the case of a backlight in a liquid crystal display element, whiteness will be realized by combining any of those selected from platinum complexes or light emitting dopants known in the art to be suitable for the wavelength region corresponding to CF (color filter) characteristics, or combining light bringing-out and/or light focusing sheets according to the present invention.

The white organic EL element of the present invention is preferred due to the following reasons. It is thereby possible to prepare a full-color organic electroluminescent display of longer operating time at lower driving voltage by obtaining blue light, green light, and red light via a blue filter, a green filter, and a red filter, respectively, employing, as a backlight, white light emitted from the organic electroluminescent element as described in claim 7, by arranging the element and the driving transistor circuit by combining it with a CF (color filter) or matching it to a CF (color filter) pattern.

<<Industrial Fields to Which the Organic EL Element of the Present Invention is Applicable>>

It is possible to employ the organic EL element of the present invention as display devices, displays, and various light emitting sources. Examples of light emitting sources include home lighting, lighting in vehicles, backlights for clocks and liquid crystals, advertizing boards, traffic lights, light sources for optical memory media, light sources for electrophotographic copiers, light sources for optical communication processors, and light sources for optical sensors, but are not limited thereto. Specifically, it is possible to effectively employ it as a backlight for various display devices combined with a color filter, a light diffusing plate, or a light bringing-out film, and light sources for lighting.

By utilizing the characteristics of the organic EL element of the present invention, it may be applied to the various lighting appliances and display devices listed below.

(Product Exhibitions and Displays)

Product exhibition and displays include product displays at shops, frozen and refrigerated items show cases, lighting of installation in museums, art museums, and exhibition halls, automatic dispensers, game machines, and transit advertisements.

Product displays in shops include decorative displays of the shop itself, show cases, POP, and signs. In shops such as up-scale brand shops, noble metal shops, fashion based shops, or high-class restaurants, which place importance on their brand images, effects of the shop image resulting front lighting are significantly great. Thus, in these fields, lighting is selected with much care. In indirect lighting fields in which atmosphere is created by making an ingenious architectural structure so that light sources are not directly visible, it is possible to list the enhancement of construction efficiency in such a manner that it is possible to eliminate the space for light sources and their instruments, whereby no complicated structure is needed, and it is also possible to eliminate the space between the light source and a diffusing plate, which are required so that no shape of light sources can be seen through the plate. Further, as a tool for changing the shop's image, no space is needed by fitting as a display shelf, a floor, and a store fixture, and by utilizing the characteristic of the light-weight light source, there are the advantages such a large degree of design freedom, higher construction efficiency, and possibility of easy acceptance.

Frozen and refrigerated items show cases are placed in supermarkets and convenience stores. In order that fresh products such as vegetables, fruit, fresh fish and dressed meat are easily viewed as items of full of "beauty" and "freshness", and are easily picked up, lighting equipment is one of the important parts. By employing organic EL light sources, adverse effects to the cooling function are low due to light emission at a relatively low temperature, and it is possible to increase storage space due to significant reduction of space for the light source due to its thin structure. Consequently, it is possible for customers to easily choose food items placed in a case of smart design and to easily pick them up. Further, it is possible to attract customers by employing colored light which enables easier evaluation as good food quality, resulting in a contribution for increased sales.

With regard to lighting in museums, art museums, and exhibition halls, in view of visibility and light damage to exhibits, it is necessary to select suitable light sources. Anti-fading fluorescent lamps of a low ratio of ultraviolet rays are developed. The organic EL light sources result in no adverse effects to exhibits due to no ultraviolet rays and a relatively low heat emission, and further, there is no glare since the light source surface emits light uniformly, whereby it is possible to faithfully appreciate exhibits as their are, based on high color rendering properties of the light sources. Further, since no large light source equipment is required, no extra bulge of the equipment is entered into the sight whereby only exhibits receive attention. Further, in a large scale exhibition hall such as a show, it is possible to easily construct a large scale decoration fitted with lights, which receive attention, due to the features such as light weight and thin structure.

In automatic dispensers, light sources are employed in sections such as push buttons, sample products, and posters on the front surface of the dispenser.

With regard to automatic dispensers, competition is occurring for additional functions to be brought in and space for placing them. Consequently, automatic dispensers are in the field where advantages of organic EL such as no requirement of space for a large light source due to a low thickness are realizable. Specifically, its application to the poster space above the coin slot is highly needed. Further, in recent years, more machines are seen which have gaming functions such as winning or losing with each sale. Thus, it is possible to further utilize the advantages by loading a light source (being a moving image display) which functions to control pixels in the poster section on the front surface.

Machines for amusement include common pinball machines and pinball machines fitted with a slot machine mechanism. For these machines for amusement, it is critical that players enjoy games while realizing excitement of amusement properties (gaming and gambling). By reducing the thickness of light sources, an advantage is realized in which it is possible to reduce the thickness of the machine. In addition, in the same manner as for automatic dispensers, a further advantage is realized by loading a light source which functions pixel control (a moving image display).

Mass transit advertisements include posters and advertising displays in public areas, posters and screens in trains and buses, and advertisements affixed to vehicle bodies. Specifically, some of these posters and advertising displays are in the form of a box, in which fluorescent lamps are employed as a backlight. In such a case, by replacing the lamps with an organic EL, it is possible to reduce the thickness and weight of the box.

Further, with regard to suspended advertising displays, by reducing the thickness of the box, it is possible to reduce of accumulation of dust and dirt, and further to overcome problems such as bird droppings.

(Built-in Lighting for Interior, Furniture, and Building Materials)

In the construction fields, those in which lighting is integrated with a floor, a wall, and a ceiling are called "architectural lighting". Representative "architectural lighting" include, according to its system, cornice lighting, troffer lighting, cove lighting, a luminous ceiling, and a louver ceiling. For these, it is desired that building elements themselves emit light so that lighting light sources are built in the ceilings, walls and floors to eliminate the existence or atmosphere as lighting.

Lighting sources employing organic EL elements are most suitable for "architectural lighting" in terms of their low thickness, light weight, color controlling, and design changeability, and are applicable even to interiors, furniture and fixtures. Via the development of organic EL light sources, it is possible to spread, to common dwelling houses, the above architectural lighting which has been employed only in shops or art museums, whereby it is possible to discover new demands.

In commercial facilities, by employing the organic EL light sources in semi-basement shops and ceilings of arcades, and by being able to easily change the brightness and color temperature of lighting, it is possible to create an optimal commercial space which is not affected by weather, or time of day.

Examples of interiors, fixtures, and furniture include a desk, a chair, or a cupboard, a shoe box, or a locker for storage, a bathroom vanity, a Buddhist altar or a sanctuary, a bed light, a foot light, a banister, a door, a paper panel, or a sliding screen which are not limited thereto.

On the other hand, it is possible to change transparency/opacity via extinction/light emitting by applying a transparent electrode to the EL light source. Thus, it is also possible to apply the resulting light source to any of the windows, doors, curtains, window shades, and partitions.

(Lighting for Automobiles and Light Emitting Displays)

For automobiles, it is possible to apply the organic EL element to lighting instruments and light emitting displays on the exterior of automobiles, as well as the interior. The former includes (minor classification) head lamps, auxiliary lamps, front position lights, fog lamps, and turn signals in the front position, and stop lamps, back position lamps, turn signals and number plate lamps as a rear combination lamp in the back position. Specifically, a sheet of the rear combination lamp is formed employing the organic EL element, and by allowing the resulting sheet to adhere to the back position, the room for lamps in the back position is reduced, whereby it is possible to increase the trunk room. Further, when visibility is poor due to rain and fog, it is possible to enhance visibility by increasing the area of front position lights and the stop lamps. On the other hand, by allowing wheels to emit light employing the organic EL element, it is possible to enhance visibility from the sides. Further, by forming a whole body employing the organic EL elements, it is possible to include new ideas to body color and design.

The latter includes, as the lighting instruments and light emitting displays in the interior of automobiles, room lights, map lights, footboard lamps in the lower part of the door, meter displays, car navigation displays, and hazard lights. Specifically, by utilizing the transparency of the organic EL element, it may be employed as a sun roof during day time, while it may be employed as a mild room light of a surface light source via light emission during night. Further, in taxies, by allowing a lighting instrument composed of the organic EL element to adhere to the back side of front seats, it is possible to construct a hand lighting system which is easily usable for customers without hindering driver's driving and sacrificing space in the room.

(Public Transportation Facilities)

It is possible to take advantage of the characteristics of the organic EL element of the present invention in lighting and displays in the interior of public transportation means such as electric trains, subway cars, buses, aircraft, and ships.

Many lighting devices are installed in aircraft. Of passenger cabin lighting, cargo room lighting, and pilot cabin lighting, advantages of the organic EL lighting are fully realized for indirect lighting in the passenger cabin.

Fluorescent lamps and incandescent bulbs are employed for lighting in the passenger cabin. These are employed in such a manner that on the ceiling, indirect lighting reflected by the side is available. The above lighting is designed so that relaxing atmosphere is created and pieces of broken glass will not fall to the passenger cabin by any possibility of troubles.

By employing these organic EL light sources, it becomes easier to realize indirect lighting. Further, when employed as direct lighting, no danger occurs in which broken pieces are scattered, and it enables creation of relaxing atmosphere under diffused light.

Further, it is critical for aircraft to reduce consumption of electric power and the body weight. Consequently preferred are organic EL light sources which consume less power and exhibit less weight. The above advantages are realized not only for aircraft passenger lighting but also for airport terminal lighting in baggage claim areas, resulting in a decrease in leftover baggage.

In facilities such as railroad stations, bus stops, and airports belonging to public transportation facilities, displays and lighting for passenger leading are employed. Further, at night, at outdoor bus stops, when bus waiting persons are detected, lighting is increased, whereby it is possible to contribute to crime prevention.

(Light Sources for OA Equipment)

Light sources for OA equipment are employed in facsimile machines, copiers, scanners, printers and composite machines thereof in which reading sensors are mounted.

Reading sensors are divided into a contact type sensor (CIS) which is combined with an equal magnification optical system, and a condensed type sensor (CCD linear) which is combined with a condensed optical system.

With regard to CIS, the definition differs depending on its maker. There is a case in which one which is subjected to a module of a sensor rod lens array LED board is called CISM (contact image sensor module), while there is a case in which a sensor chip incorporated in the module is called CIS. In these light sources, employed are LEDs, xenon, CCFL lamps, and LDs.

OA equipment is continually demanded to be smaller and to be driven at lower voltage. Characteristics of the organic EL which is extremely thin and is drivable at low heat generation and low voltage are capable of meeting these demands.

(Industrial Testing System)

In manufacturing companies, a large number of man-hours and manpower is spent in visual inspection processes. However, the above processes have been automated to detect missing parts utilizing captured images. The image of an object, captured by a CCD camera, is transformed to digital signals, and characteristics of the object, such as area, length, quantity, and position are extracted via arithmetic processing, whereby determination results are outputted. In order to capture the above images, light sources are necessary. The above testing system is employed for a package and shape size test, and a micro-part test.

Lighting sources employed for image sensors include fluorescent lamps, LEDs, and halogen lamps. Of these, as a backlight which illuminates a transparent vessel and a lead frame from the background, required is light which is uniform in a plane shape.

Further, in order to detect the stain of sheet, light is required which is linearly uniform and is capable of illuminating the front surface in the lateral direction. As noted above, requirements for light sources vary depending on the item to be tested.

By employing the organic EL light sources in this field, for example, in a bottling process, lighting is arranged 360° around a bottle, and it is possible to achieve full image capture via a single lighting, whereby it is possible to achieve inspection within a shorter time. Further, it is possible to significantly reduce the space occupied by a light source within the interior of testing instrument. Further, since it is a surface light source, it is possible to avoid inspection errors due to difficulty of measurement of captured images via light reflection.

(Light Sources for Growing Agricultural Products)

The term, "plant factory" refers to "a year-round production system of plants utilizing high technology such as environmental control and automation". Technology is employed which automatically produces plants without dependence on weather and without manpower by controlling the plant-growing environment via computer. When world population growth and environmental problems in the future are considered, it is necessary to achieve so-called agriculture industrialization leading to stable food production via introduction of higher technology in agriculture. Recently, the possibility of application of LEDs and LDs as a plant growing light source has been enhanced. Light sources such as high pressure sodium lamps, which have frequently been employed, result in a poor spectral balance of red to blue light. Further, its large amount of generated heat increases an air condition loads and makes it necessary to take a sufficient distance from plants, resulting in a problem of an increase in the size of facilities.

The thickness of organic EL light sources is minimal so that many shelves are arranged, and the heat release value is low, whereby higher efficiency is achieved by placing them nearer the plants. Thus, it is possible to increase the cultivated amount.

Further, by utilizing the advantage of better space saving, in typical homes, it is possible to keep a vegetable garden in small kitchens. The concept that vegetable gardens are possible only outdoors such a garden, a porch or a rooftop is altered so that it becomes possible for many people to enjoy vegetable gardens.

(Escape Lighting)

Disaster prevention lighting equipment, specified by the Fire Defense Law, and the Building Standard Law, includes guiding lamps which show exits and escape routes during fires of buildings, and emergency lamps to assure brightness of escape routes for quicker escape.

Signals, guide lamps and emergency lamps, which are employed for FA and public use, are premised to be easily seen. Consequently, an excessive increase in their size results in unbalance against buildings depending on their arranged positions. Such unbalance has often been pointed out by architects and designers. To overcome the above, taken are countermeasures such as the use of pictographs which are understood at a glance, and enhanced eye catching effects employing light sources. Heretofore, fluorescent lamps have often been employed as the light source of such guide lamps, but recently, guide lamps employing LEDs have appeared.

Applying organic EL light sources to the above guide lamps enables no decrease in luminance due to its uniformity and angle characteristics and enhancing visibility, enables easier installation without special engineering works due to their low electric power and low thickness, and eliminates replacement compared to the type which employs fluorescent lamps, and enables easier maintenance. Further, color fading of the light emitting surface is less due to minimal heat generation. Accordingly, it is possible to enhance safety via installation in many places such as floors, stairs, or banisters of escape routes, or fire doors. Further, no current mercury problems occur which are concerned for fluorescent lamps, and they are hardly broken exhibiting excellent safety. Further, it may be stated that they are light sources which enable enhanced eye catching effects without spoiling beauty due to the space saving and thin type design.

(Lighting for Imaging)

Light sources, employed in photo studios and identification picture booths, include halogen lamps, tungsten lamps, strobe lights, and fluorescent lamps. Each photo is made using two types of light, such as one in which light from the above light sources is directly and linearly incident to the subject to result in strong shades, or the other in which mild light which results in much less shades is made, are combined in various angles. Light is diffused via a method in which a diffuser is sandwiched by the light source and the subject, or in which reflected light being incident to another surface (a reflector) is employed.

The organic EL light source emits diffused light, whereby it is able to emit light corresponding to the former without using a diffuser. In such a case, advantages are realized in that a space between the light source and the diffuser, which is needed for the conventional light sources, becomes unnecessary and it is possible to control detailed shading, which is conducted by delicate angle adjustment of light employing a reflector, or by bending a flexible type organic EL itself.

Color rendering is occasionally required for light sources employed for imaging. When color appears very different from that when viewed under sun light, color rendering is evaluated to be poor, while when the difference is small, color rendering is evaluated to be good. It is hardly stated that fluorescent lamps, employed in typical homes, are preferable for imaging due to their wavelength characteristics and lighted portions tend to be greenish. In many cases, it is required that skin, make-up, hair, kimono, and jewelry are imaged to result in faithful color. The color rendering is one of the critical factors for light. The organic EL light sources exhibit excellent color rendering and are preferable for imaging in which faithful colors are demanded. The above advantage is also utilized in the place where faithful evaluation of colors related to printing and dying are intended.

By arranging surface light sources such as the organic EL light source on an entire ceiling, during image capturing of children and pets, it is possible to capture relaxed and natural expression, since without inhibition of movement, children and pets can be allowed to play freely in the room.

(Electric Home Appliances)

In many cases, light sources are incorporated in electric home appliances for ease for viewing details, ease for work, and their designs. For example, microwave ovens, sewing machines, dish washing and drying machines, refrigerators, and AV equipment have been fitted with light sources, but recently, clothes washing and drying machines of a horizontal type have been fitted with internal light sources to reduce cases of forgotten items of clothes within them. In conventional machines, incandescent electric bulbs and LEDs are often installed. Hereinafter, it is possible to consider various applications such that by arranging a lighting unit at the tip of a vacuum cleaner, shaded areas by an article of furniture can be confirmed to be clean, or by arranging, in an electric shaver, a light source emitting a specified wavelength of light, the resulting state of shaving can be monitored.

The above electric home appliances are required to realize a decrease in overall weight and size and further an increase in storage space. The light source portion is required to use space as small as possible while the entire area can be illuminated. The thin organic EL surface light source is able to fully meet the above demands.

(Play Room)

By arranging lighting employing the organic EL under the ice of a skating rink, it is possible to make representation which differs from one employing spot lights above the rink floor. The organic EL is particularly advantageous to this use due to its low light emission temperature. Further, it is possible to emit light synchronized with skaters' motion via detection of the skaters' position. Combination effects of the organic EL with spotlights and light emission in conjunction with music rhythms are effective to make a show more attractive.

In a planetarium, instead of conventional projection from a lower position, it is possible to employ a system in which the dome itself simulates stars by arranging minute pixels of organic EL over the entire dome, whereby it is possible to realize a planetarium without a projector.

(Lighting for Illumination)

Commonly, the term "illumination" in Japan has been referred, in the most cases, to illumination for trees. However, in view of environmental protection, in recent years, cases have increased in which decorations are applied to structures such as houses, gates or hedges, differing from the conventional trees. In those, a main stream is that many point light sources are employed and decorations are achieved in the form of lines, and due to the appearance of LEDs, it is forecast that the above will further increase.

By employing the organic EL lighting in this field, it is possible to further enhance presentation effects due to lighting as follows. Heretofore, representation has been achieved via only connection of point light sources. However, for illuminating the above trees, variation is achieved in which leaf-shaped light sources are attached, an entire tree is illuminated by twisting light sources around the entire tree, and adversely, via connection as a stylized surface module in the same way as a point light source, as a whole, characters and pictures are formed while employing as a cocktail palette which is lighted to various colors, whereby illumination effects may be further enhanced.

(Lighting Fitted with Belongings and Clothing)

Light reflective materials (such as light reflective sheets) are marketed and utilized while being attached to any of the belongings, shoes, or clothes during outdoor walking or exercise at night so that reflection of head lights is readily noticed by bicyclists or car drivers to defend one's security.

In the case of a glass bead type, minute glass beads are mounted on the surface, and incident light is subjected to retroreflection in the light source direction via the function of the above lens. When light from the headlights of a car is directed to the above, light is returned into the eye position of drivers, and the drivers view strong and brilliant light. In the case of a prism type, the same functions are employed, but the structure of the lens differs. The glass bead type is characterized in that a high reflection effect is realized for light in the oblique direction, while the prism type is characterized in that it more reflects light from the front than the glass bead type, but occasionally results in relatively low reflection effects for light in the oblique direction. Further, it is possible to select materials and any of the adhesion methods, depending on hardness of place to be adhered. In any of the conventional cases, in order that pedestrians are noticeable, it is essential that light is reflected. In a backward parking place, ingenuity such as adhesion to foot is required so that headlights directed downward are reflected as early as possible.

By employing the organic EL light source as an alternative to reflectors, it is possible to allow drivers to notice pedestrians prior to the range when the headlights are reflected, resulting in more secured safety. Further, for other light sources, it is possible to employ a thin sheet-shaped type, whereby it is possible to realize effects while maintaining an advantage as a seal. These are applied not only to people's clothing but also to pet clothing. When a low power consuming organic EL is available, it is possible to emit light employing generated electricity while walking. Specifically, it is possible to achieve application to a person specifying clothing, and for example, it is possible to contribute to earlier protection of wanderers. By having a wet suit for diving emit light, it may be possible to identify the position of a diver and the diver may protect oneself from sharks. Needless to say, it is possible to apply EL light sources to entertainers' garments at shows, as well as and wedding dresses.

(Light Sources for Communication)

Further, it is possible to effectively utilize light emitters employing such organic EL elements in a "visible light tag" which sends simple messages and information employing visible light. Namely, by realizing light emission of signals due to blinking lights of an extremely short duration, it is possible to send a large amount of information to persons receiving the same.

Even when the light emitter emits light signals, duration between the signals is very short, whereby human eyes recognize them as continuous lighting. Lighting arranged on roads, and in shops, exhibition halls, hotels, or amusement parks, transmits typical information signals of each of the places so that necessary information can be provided. In the case of an organic EL, a plurality of light emitting dopants which differ in wavelength is incorporated in a single light emitter, and by generating different signals for each of the different wavelengths, a single light emitter is able to provide a plurality of different pieces of information. In such cases, an organic EL, which emits stable wavelengths of light and stable color tone, is advantageous.

Differing from information delivery employing voices, electric waves, and infrared rays, "visible light tags" are simultaneously incorporated as a lighting means, whereby troublesome additional installation is unnecessary.

(Medical Light Sources)

By applying an organic EL to lighting of an endoscope which currently employs halogen lamps are employed, or to lighting for abdominal operation which is achieved by inserting a wire, a decrease in size and weight is achieved, whereby its use will likely expand. The organic EL may be applied to the endoscope capsule (an oral endoscope) employed for internal body inspection and medical treatment which have received increased attention in recent years. Thus, the organic EL is prospective.

(Others)

An emitter into which the organic EL element of the present invention is incorporated enables easy selection of color tone, results in no blinking which is seen in fluorescent lamps, and results in stable color tone under relatively low power consumption. Consequently, it is useful as the insect pest controlling apparatus, described in JP-A No. 2001-269105, the lighting for a mirror, described in JP-A No. 2001-286373, the bath room lighting system, described in JP-A No. 2003-288995, the artificial light source for growing plants, described in JP-A No. 2004-321074, the light emitter of a water pollution measuring apparatus, described in JP-A No. 2004-354232, an adhesion body for a medical treatment employing light-sensitive medicine, described in JP-A No. 2004-358063, and the medical shadowless lamp, described in JP-A No. 2005-322602.

EXAMPLES

The present invention will now specifically be described, however the present invention is not limited thereto. "Parts"

or "%" when employed in the examples represent "parts by weight" or "% by weight", respectively.

Example 1

Preparation of Organic Electroluminescent Elements (Preparation of Organic Electroluminescent Element 1)

A 120 nm thick ITO (indium tin oxide) film was formed as an anode on a 0.7 mm thick 30 mm×30 mm glass substrate. The resulting substrate was subjected to patterning. Thereafter, the transparent substrate, fitted with the above ITO transparent electrode, was subjected to ultrasonic cleaning employing isopropyl alcohol, dried employing nitrogen gas, and subjected to UV ozone cleaning over 5 minutes. Thereafter, the resulting transparent substrate was fixed in the substrate holder in a plasma treatment chamber which was connected to a commercial vacuum deposition apparatus. Further, each of the materials in an optimal amount constituting each layer was placed in each crucible for deposition in the vacuum deposition apparatus. The employed crucible for deposition was prepared via resistance heating materials such as molybdenum or tungsten.

After carrying out a plasma treatment for two minutes at an oxygen pressure of 1 Pa and a power of 100 W (electrode area of approximately 450 $cm^2$), the resulting substrate was transferred to an organic layer deposition chamber without exposure to ambient atmosphere, and an organic layer film was prepared.

Initially, after reducing pressure to a vacuum degree of $1 \times 10^{-4}$ Pa, the above crucible for deposition in which m-MTDATA was placed was energized and deposition was conducted onto the transparent substrate at a deposition rate of 0.1 nm/second, whereby a 10 nm positive hole injecting layer was provided. Subsequently, α-NPD was deposited in the same manner as above, whereby a 30 nm positive hole transporting layer was provided.

Subsequently, each light emitting layer was prepared according to the following procedures.

Compounds D-1, D-2, and CBP were simultaneously deposited at a deposition rate of 0.1 nm/second so that the concentration of D-1 and D-2 resulted in 14% by weight and 1.8% by weight, respectively, whereby a 6 nm thick and 622 nm maximum wavelength yellow phosphorescence emitting layer (Light Emitting Layer A listed in Table 2, the second light emitting layer) was formed. Subsequently, Compounds D-3 and H-1 were simultaneously deposited at a deposition rate of 0.1 nm/second so that the concentration of D-3 resulted in 9% by weight, whereby a 470 nm maximum wavelength and 30 nm thick blue phosphorescence emitting layer (Light Emitting Layer B listed in Table 3, the first light emitting layer) was formed. Thereafter, Compound M-1 was deposited to result in a thickness of 10 nm, whereby a positive hole blocking layer was formed. Further, CsF was deposited together with Compound M-1 to result in 10% in terms of film thickness ratio, whereby a 45 nm thick electron transporting layer was formed.

Further, 110 nm aluminum was deposited to from a cathode, whereby Organic EL Element 1 was prepared.

Figure 2:
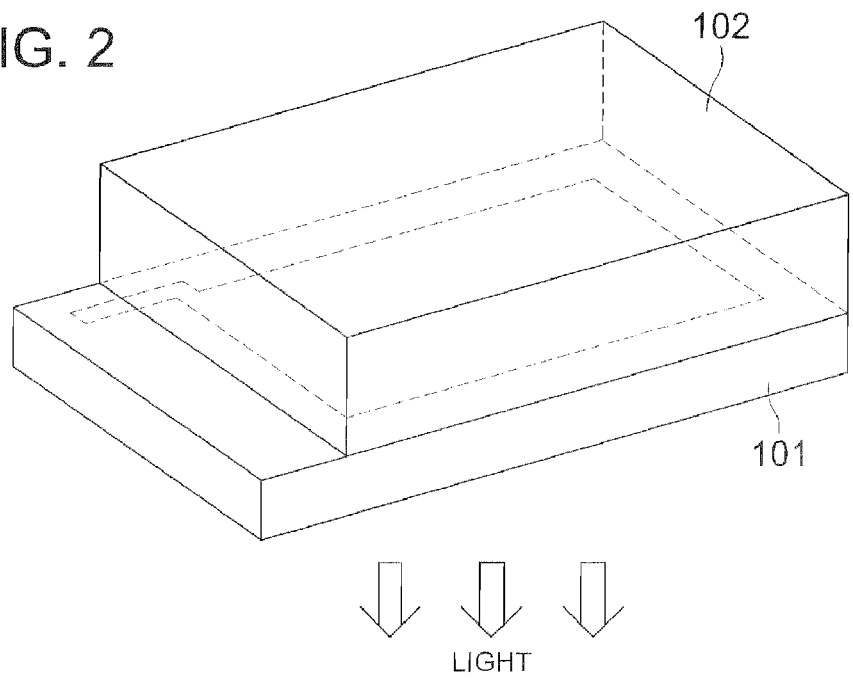
FIG. 2 is a schematic view showing one example of a lighting device into which the organic EL element of the present invention is incorporated.
Figure 3:
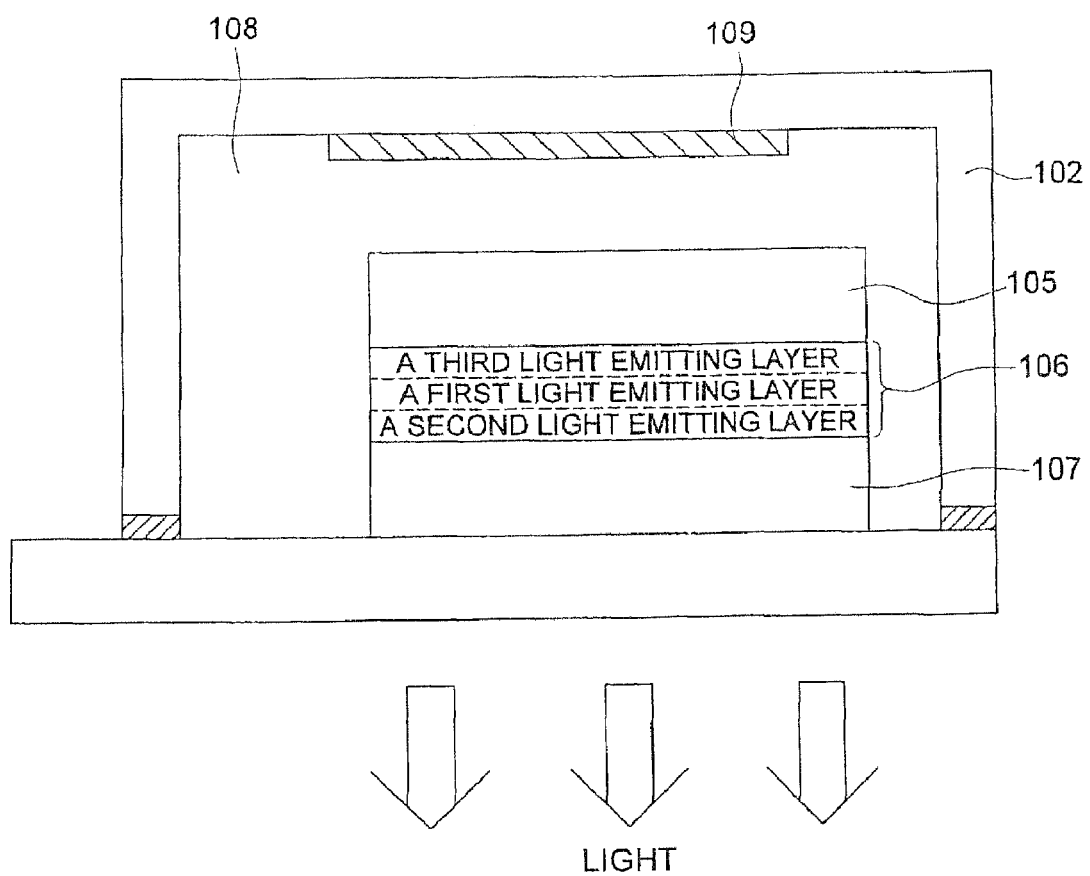
FIG. 3 is a cross-sectional view showing one example of a lighting apparatus into which the organic EL element of the present invention is incorporated.

Subsequently, the non-light emitting surface of Organic EL Element 1 was enclosed in a glass case, and Lighting Device 1, which was constituted as shown in FIGS. 2 and 3, was prepared.

FIG. 2 is a schematic view of a lighting device in which organic EL element 101 is covered with glass cover 102. Sealing, employing the glass cover, was conducted in a glove box under a nitrogen ambience (ambience of high purity nitrogen gas at a purity of at least 99.999%) without allowing it to come into contact with atmosphere. FIG. 3 is a cross-sectional view of a lighting device, in which 105 represents a cathode, 106 represents an organic EL layer, and 107 represents a glass substrate fitted with a transparent electrode. Glass cover 102 is filled with nitrogen gas 108 and water absorbing agent 109 is provided.

(Preparation of Organic Electroluminescent Element 2)

Organic Electroluminescent Element 2 was prepared in the same manner as above Organic Electroluminescent Element 1, except that each of the light emitting layers was provided via the following procedures, and a lighting device employing the same was prepared.

(Preparation of Each Light Emitting Layer in Organic Electroluminescent Element 2)

Compounds D-3 and H-1 were simultaneously deposited at a deposition rate of 0.1 nm/second so that the concentration of D-3 resulted in 9% by weight, whereby a 470 nm emitted light maximum wavelength and 20 nm thick blue phosphorescence emitting layer (Light Emitting Layer A listed in Table 2, the second light emitting layer) was formed. Subsequently, Compounds D-1 and CBP were simultaneously deposited at a deposition rate of 0.1 nm/second so that the concentration of D-1 resulted in 5 nm by weight, whereby a 518 nm maximum wavelength and 5 nm thick green phosphorescence emitting layer (Light Emitting Layer B listed in Table 3, the first light emitting layer) was formed. Subsequently, Compounds D-2 and CBP were simultaneously deposited at a deposition rate of 0.1 nm/second so that the concentration of D-2 resulted in 8% by weight, whereby a 622 nm emitted light maximum wavelength and 5 nm thick red phosphorescence emitting layer (Light Emitting Layer C listed in Table 4, the third light emitting layer) was formed.

(Preparation of Organic Electroluminescent Elements 3-9)

Organic Electroluminescent Elements 3-9 were prepared in the same manner as Organic Electroluminescent Element 2, except that light emitting materials, host compounds, dope concentration, and film thickness in each of the Light Emitting Layers 1-3 were changed as listed in Tables 2-4.

Table 4B shows the color of emission light from each layer of each sample examined.

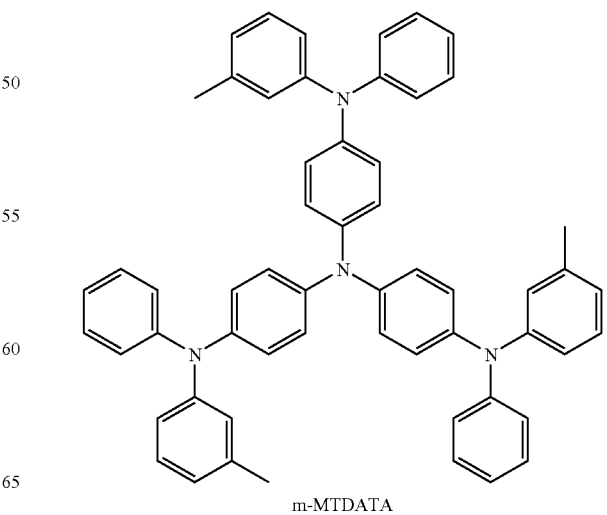

m-MTDATA

-continued
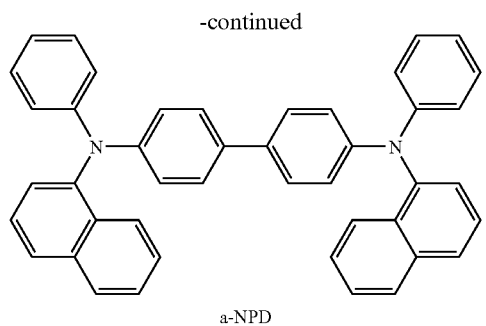
a-NPD
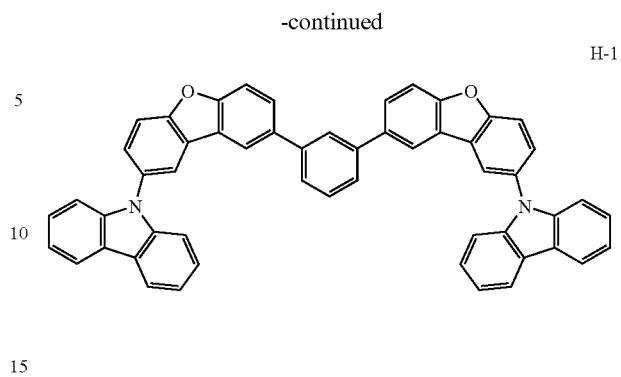
H-1
D-1
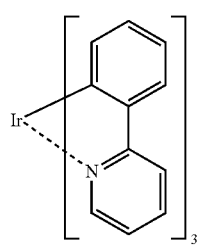
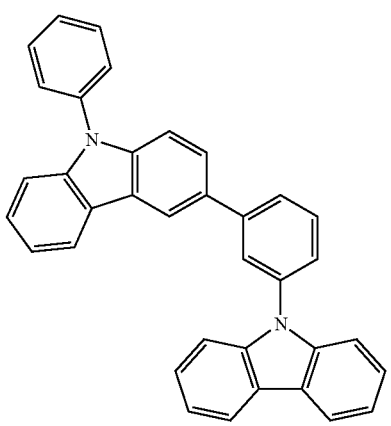
H-2
D-2
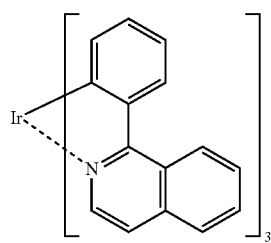
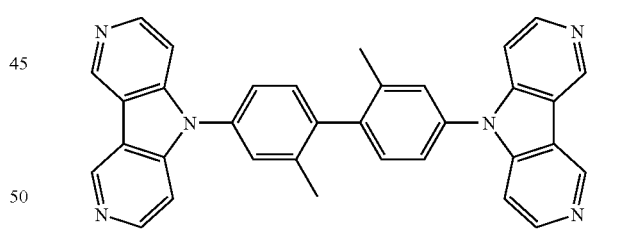
M-1
D-3
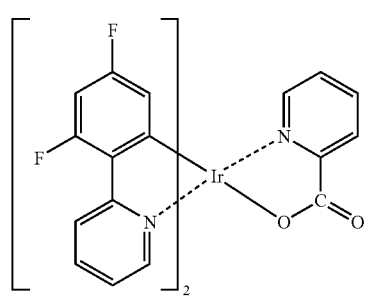
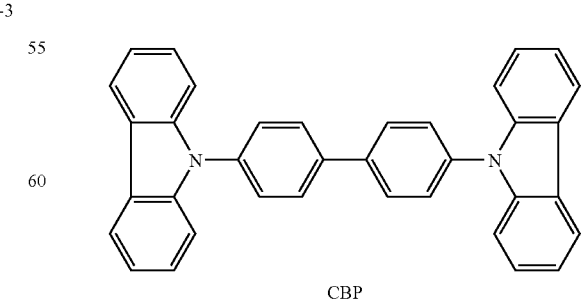
CBP

TABLE 2

Light Emitting Layer A
(The second light emitting layer)

| Element No. | Light Emitting Material | Dope Concentration (% by weight) | Host Compound | Film Thickness (nm) | Emitted Light Maximum Wavelength (nm) | Type |
|---|---|---|---|---|---|---|
| 1 | D-1 | 14 | CBP | 6 | 518 | Comp. |
|   | D-2 | 1.8 |   |   | 622 |   |
| 2 | D-3 | 9 | H-1 | 20 | 470 | Comp. |
| 3 | D-2 | 8 | CBP | 10 | 622 | Inv. |
| 4 | 1-79 | 5 | CBP | 10 | 473 | Inv. |
| 5 | 1-79 | 5 | H-1 | 10 | 473 | Inv. |
| 6 | D-1 | 10 | CBP | 8 | 518 | Inv. |
|   | D-2 | 1 |   |   | 622 |   |
| 7 | D-1 | 10 | H-1 | 8 | 518 | Inv. |
|   | D-2 | 1 |   |   | 622 |   |
| 8 | D-1 | 10 | H-1 | 8 | 518 | Inv. |
|   | D-2 | 1 |   |   | 622 |   |
| 9 | D-1 | 10 | H-1 | 8 | 518 | Inv. |
|   | D-2 | 1 |   |   | 622 |   |

Comp.: Comparative Example,
Inv.: Present Invention

TABLE 3

Light Emitting Layer B
(The first light emitting layer)

| Element No. | Light Emitting Material | Dope Concentration (% by weight) | Host Compound | Film Thickness (nm) | Emitted Light Maximum Wavelength (nm) | Type |
|---|---|---|---|---|---|---|
| 1 | D-3 | 9 | H-1 | 30 | 470 | Comp. |
| 2 | D-1 | 5 | CBP | 20 | 518 | Comp. |
| 3 | 1-79 | 12 | H-1 | 20 | 473 | Inv. |
|   | D-1 | 0.1 |   |   | 518 |   |
| 4 | D-1 | 10 | H-1 | 8 | 518 | Inv. |
|   | D-2 | 1 |   |   | 622 |   |
| 5 | D-1 | 10 | H-1 | 8 | 518 | Inv. |
|   | D-2 | 1 |   |   | 622 |   |
| 6 | 1-79 | 9 | H-1 | 20 | 473 | Inv. |
| 7 | 1-79 | 9 | H-1 | 20 | 473 | Inv. |
| 8 | 1-79 | 9 | H-1 | 20 | 473 | Inv. |
| 9 | 1-90 | 9 | H-1 | 15 | 473 | Inv. |

Comp.: Comparative Example,
Inv.: Present Invention

TABLE 4

Light Emitting Layer C
(The third light emitting layer)

| Element No. | Light Emitting Material | Dope Concentration (% by weight) | Host Compound | Film Thickness (nm) | Emitted Light Maximum Wavelength (nm) | Type |
|---|---|---|---|---|---|---|
| 1 | — | — | — | — | — | Comp. |
| 2 | D-2 | 8 | CBP | 5 | 622 | Comp. |
| 3 | D-2 | 8 | H-2 | 10 | 622 | Inv. |
| 4 | 1-79 | 5 | H-2 | 10 | 473 | Inv. |
| 5 | 1-79 | 5 | H-2 | 10 | 473 | Inv. |
| 6 | D-1 | 10 | H-2 | 8 | 518 | Inv. |
|   | D-2 | 1 |   |   | 622 |   |
| 7 | D-1 | 10 | H-2 | 8 | 518 | Inv. |
|   | D-2 | 1 |   |   | 622 |   |
| 8 | D-1 | 10 | H-1 | 8 | 518 | Inv. |
|   | D-2 | 1 |   |   | 622 |   |

TABLE 4-continued

| | Light Emitting Layer C (The third light emitting layer) | | | | | |
|---|---|---|---|---|---|---|
| Element No. | Light Emitting Material | Dope Concentration (% by weight) | Host Compound | Film Thickness (nm) | Emitted Light Maximum Wavelength (nm) | Type |
| 9 | D-1 | 10 | H-1 | 8 | 518 | Inv. |
| | D-2 | 1 | | | 622 | |

Comp.: Comparative Example,
Inv.: Present Invention

TABLE 4B

| Element No. | Light Emitting Layer A (The second light emitting layer) | Light Emitting Layer B (The first light emitting layer) | Light Emitting Layer C (The third light emitting layer) | Type |
|---|---|---|---|---|
| 1 | Yellow | Blue | — | Comp. |
| 2 | Blue | Green | Red | Comp. |
| 3 | Red | Green | Red | Inv. |
| 4 | Blue | Yellow | Blue | Inv. |
| 5 | Blue | Yellow | Blue | Inv. |
| 6 | Yellow | Blue | Yellow | Inv. |
| 7 | Yellow | Blue | Yellow | Inv. |
| 8 | Yellow | Blue | Yellow | Inv. |
| 9 | Yellow | Blue | Yellow | Inv. |

<<Evaluation of Organic EL Elements>>

(Determination of Electric Power)

The front luminance and luminance angle dependence of each organic EL element was determined employing a spectroradiometric luminance meter (produced by Konica Minolta Sensing Inc.), and the electric power efficiency at a front luminescence of 1,000 cd/m² was determined. In Table 5, relative values are listed when the electric power efficiency of Organic EL Element 1 is 100.

(Evaluation of Chromaticity Stability during Electric Density Variation)

By employing a spectroradiometric luminance meter (produced by Konica Minolta Sensing Inc.), chromaticity at application of an electric density of 1 mA/cm² to each organic EL element was determined. Subsequently, chromaticity difference ΔE was obtained by the following formula.

$$\Delta E = (\Delta x^2 + \Delta y^2)^{1/2}$$

wherein x any y are chromaticity x and y in CIE 1931 Color Specification system, respectively.

(Evaluation of Chromaticity Stability during Driving Duration)

Luminance variation during continuous driving was traced employing a front luminance of 4,000 cd/m² as an initial luminescence. Chromaticity at t=0 and chromaticity at its half period were determined via a spectroradiometric luminance meter (produced by Konica Minolta Sensing Inc.), and resulting chromaticity difference ΔE was obtained by the following formula.

$$\Delta E = (\Delta x^2 + \Delta y^2)^{1/2}$$

wherein x any y are chromaticity x and y in CIE 1931 Color Specification system, respectively.

Table 5 shows the evaluation results.

TABLE 5

| Element No. | Electric Power Efficiency | Chromaticity Variation during Change of Electric Current Density (ΔE) | Chromaticity Variation during Driving (ΔE) | Type |
|---|---|---|---|---|
| 1 | 100 | 0.07 | 0.07 | Comp. |
| 2 | 103 | 0.07 | 0.08 | Comp. |
| 3 | 111 | 0.05 | 0.05 | Inv. |
| 4 | 119 | 0.04 | 0.04 | Inv. |
| 5 | 122 | 0.04 | 0.03 | Inv. |
| 6 | 136 | 0.03 | 0.02 | Inv. |
| 7 | 139 | 0.02 | 0.02 | Inv. |
| 8 | 143 | 0.01 | 0.02 | Inv. |
| 9 | 140 | 0.01 | 0.02 | Inv. |

Comp.: Comparative Example,
Inv.: Present Invention

As can clearly be seen from Table 5, the organic electroluminescent elements of the present invention exhibited high electric power efficiency and excellent chromaticity stability during change of electric current density and an elapse of the driving period.

What is claimed is:

1. A white light-emitting organic electroluminescent element comprising a substrate having thereon:
   an anode;
   a cathode; and
   a plurality of light emitting layers between the anode and the cathode,
   wherein the plurality of light emitting layers comprises:
   a first light emitting layer which emits a light having a predetermined wavelength;
   a second light emitting layer which is located at a nearer position to the anode than the first light emitting layer and emits a light having a complementary color to the light having the predetermined wavelength; and
   a third light emitting layer which is located at a nearer position to the cathode than the first light emitting layer and emits the light having the complementary color to the light having the predetermined wavelength.

2. The white light-emitting organic electroluminescent element of claim 1,
   wherein one of the first light emitting layer, the second light emitting layer and the third light emitting layer is a blue light emitting layer which emits a light having a maximum luminescent wavelength of 480 nm or less.

3. The white light-emitting organic electroluminescent element of claim 2,
wherein both the second light emitting layer and the third light emitting layer comprise:
a green light-emitting material which emits a light having a maximum luminescent wavelength of 510-570 nm; and
a red light-emitting material which emits a light having a maximum luminescent wavelength of 590-650 mm.

4. The white light-emitting organic electroluminescent element of claim 1,
wherein at least two of the first light emitting layer, the second light emitting layer and the third light emitting layer comprise a host compound having the same chemical structure.

5. A lighting device comprising the white light-emitting organic electroluminescent element of claim 1.

* * * * *